(12) United States Patent
Woo et al.

(10) Patent No.: US 10,332,438 B2
(45) Date of Patent: Jun. 25, 2019

(54) DISPLAY DEVICE AND DRIVING METHOD THEREOF

(71) Applicant: Samsung Display Co., Ltd., Yongin-si, Gyeonggi-do (KR)

(72) Inventors: Min Kyu Woo, Yongin-si (KR); Seung Kyu Lee, Yongin-si (KR); Jae Du Noh, Yongin-si (KR); Min Woo Byun, Yongin-si (KR); Jae Sic Lee, Yongin-si (KR); Seung Yeon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/800,576

(22) Filed: Nov. 1, 2017

(65) Prior Publication Data

US 2018/0158393 A1 Jun. 7, 2018

(30) Foreign Application Priority Data

Dec. 7, 2016 (KR) .......................... 10-2016-0166130

(51) Int. Cl.
*G09G 3/20* (2006.01)
*G09G 3/3266* (2016.01)
(Continued)

(52) U.S. Cl.
CPC ......... *G09G 3/2014* (2013.01); *G09G 3/2022* (2013.01); *G09G 3/3266* (2013.01);
(Continued)

(58) Field of Classification Search
CPC ............... G09G 3/3266; G09G 3/3233; G09G 2310/0221
See application file for complete search history.

(56) References Cited

U.S. PATENT DOCUMENTS 9,183,781 B2 11/2015 Jang
2007/0159441 A1 7/2007 Yang et al.
(Continued)

FOREIGN PATENT DOCUMENTS

EP 1519354 A2 3/2005
KR 10-2013-0000020 1/2013

OTHER PUBLICATIONS

Extended European Search Report dated Mar. 12, 2018 of the corresponding European Patent Application No. 17205697.0, noting listed references in this IDS (10 pages).

*Primary Examiner* — Gerald Johnson
(74) *Attorney, Agent, or Firm* — Lewis Roca Rothgerber Christie LLP

(57) ABSTRACT

A display device includes: first pixels at a first pixel area and connected to first scan lines; a first scan driver to supply first scan signals to the first scan lines; second pixels at a second pixel area and connected to second scan lines; a second scan driver to supply second scan signals to the second scan lines; third pixels at a third pixel area and connected to third scan lines; and a third scan driver to supply third scan signals to the third scan lines. In a first mode, each of the first scan signals has at least a portion having a first pulse width, and each of the second scan signals has at least a portion having a second pulse width different from the first pulse width.

19 Claims, 19 Drawing Sheets

(51) Int. Cl.
  *G09G 3/3233* (2016.01)
  *G11C 19/28* (2006.01)
(52) U.S. Cl.
  CPC ... *G09G 3/3233* (2013.01); *G09G 2310/0218* (2013.01); *G09G 2310/0221* (2013.01); *G09G 2310/0232* (2013.01); *G09G 2310/0286* (2013.01); *G09G 2310/067* (2013.01); *G09G 2340/0478* (2013.01); *G11C 19/28* (2013.01)

(56) References Cited

U.S. PATENT DOCUMENTS

2014/0192103 A1    7/2014  Ha
2015/0002558 A1*   1/2015  Kumeta ............... G09G 3/3233
                                                          345/690
2016/0155387 A1    6/2016  Kim et al.

\* cited by examiner

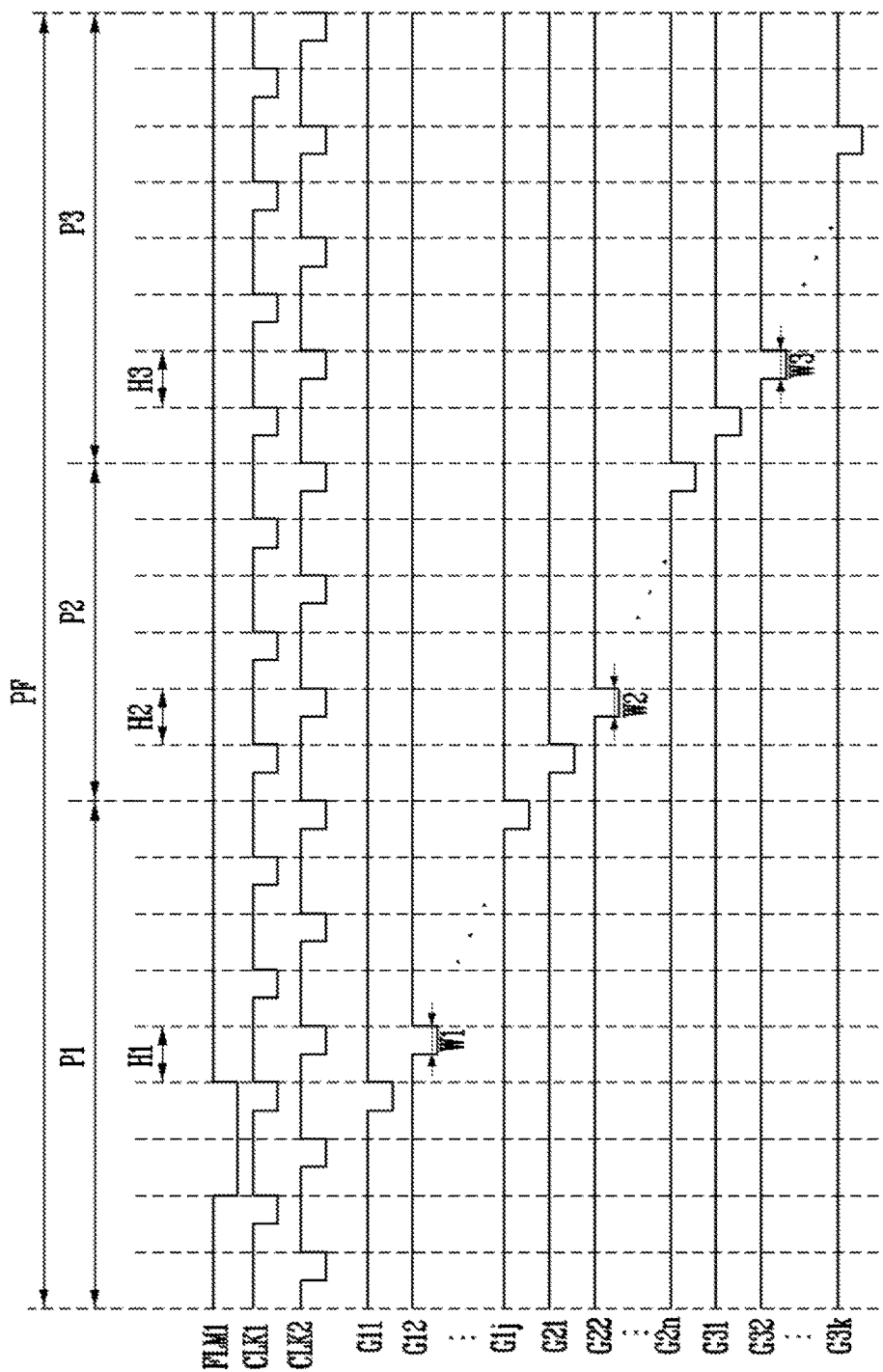

DISPLAY DEVICE AND DRIVING METHOD THEREOF

CROSS-REFERENCE TO RELATED APPLICATION

This application claims priority to and the benefit of Korean Patent Application No. 10-2016-0166130, filed on Dec. 7, 2016, in the Korean Intellectual Property Office, the entire content of which is incorporated herein by reference in its entirety.

BACKGROUND

1. Field

One or more aspects of exemplary embodiments of the present disclosure relate to a display device, and a driving method thereof.

2. Description of the Related Art

Recently, various electronic devices, which are directly wearable on a body, have been developed. The devices are commonly called wearable electronic devices.

Particularly, as an example of the wearable electronic device, a Head Mounted Display Device (HMD) displays a realistic image, so that the HMD provides a high-degree of immersion to be used for various uses, for example, watching a movie.

SUMMARY

One or more aspects of example embodiments of the present disclosure are directed toward a display device with improved display quality, and a driving method thereof.

According to an exemplary embodiment of the present disclosure, a display device includes: first pixels at a first pixel area and connected to first scan lines; a first scan driver configured to supply first scan signals to the first scan lines; second pixels at a second pixel area and connected to second scan lines; a second scan driver configured to supply second scan signals to the second scan lines; third pixels at a third pixel area and connected to third scan lines; and a third scan driver configured to supply third scan signals to the third scan lines. In a first mode, each of the first scan signals has at least a portion having a first pulse width, and each of the second scan signals has at least a portion having a second pulse width different from the first pulse width.

The first pulse width may be smaller than the second pulse width.

In a second mode different from the first mode, the first scan signals and the second scan signals may have the same pulse width.

In the first mode, each of the third scan signals may have at least a portion having a third pulse width different from the second pulse width.

The third pulse width may be smaller than the second pulse width.

In the second mode, the first scan signals, the second scan signals, and the third scan signals may have the same pulse width.

The second pixel area may be between the first pixel area and the third pixel area.

The first pixel area and the third pixel area may have smaller areas than an area of the second pixel area.

The first scan driver, the second scan driver, and the third scan driver may be configured to sequentially supply the first scan signals, the second scan signals, and the third scan signals during one frame period.

The one frame period may include a first period for supplying the first scan signals, a second period for supplying the second scan signals, and a third period for supplying the third scan signals.

Each of the first period, the second period, and the third period may include a plurality of horizontal periods, and in the first mode, lengths of the horizontal periods of each of the first period and the third period may be smaller than lengths of the horizontal periods of the second period.

In the second mode, the lengths of the horizontal periods of each of the first period, the second period, and the third period may be the same.

Each of the first scan signals, the second scan signals, and the third scan signals may include a plurality of pulses.

In the first mode, each horizontal line of the first pixel area may be configured to display the same image, and each horizontal line of the third pixel area may be configured to display the same image.

In the first mode, each horizontal line of the first pixel area may be configured to display, during a current frame, the same image that is displayed in a first horizontal line of the second pixel area during a previous frame.

In the first mode, each horizontal line of the third pixel area may be configured to display, during the current frame, the same image that is displayed in a last horizontal line of the second pixel area during the previous frame.

The first scan driver may be configured to start supplying the first scan signals in response to a start signal, the second scan driver may be configured to start supplying the second scan signals in response to a last first scan signal from among the first scan signals, and the third scan driver may be configured to start supplying the third scan signals in response to a last second scan signal from among the second scan signals.

According to an exemplary embodiment of the present disclosure, a method of driving a display device includes: supplying first scan signals, second scan signals, and third scan signals to first pixels of a first pixel area, second pixels of a second pixel area, and third pixels of a third pixel area, respectively, each of the first scan signals, the second scan signals, and the third scan signals having the same pulse width, when the display device is driven in a second mode; switching the display device from the second mode to a first mode; and supplying the first scan signals having a first pulse width, the second scan signals having a second pulse width, and the third scan signals having a third pulse width to the first pixels, the second pixels, and the third pixels, respectively, when the display device is driven in the first mode. The first pulse width and the third pulse width are different from the second pulse width.

The first pulse width and the third pulse width may be smaller than the second pulse width.

The display device may be switched to the first mode when the display device is mounted on a wearable device.

According to one or more exemplary embodiments of the present disclosure, a display device having an improved display quality may be provided, and the driving method thereof.

BRIEF DESCRIPTION OF THE DRAWINGS

The above and other aspects and features of the present disclosure will become more apparent to those skilled in the art from the following detailed description of the exemplary embodiments with reference to the accompanying drawings.

FIGS. 6A and 6B are waveform diagrams for describing a driving method of the display device according to an exemplary embodiment of the present disclosure.

DETAILED DESCRIPTION

Figure 1A:
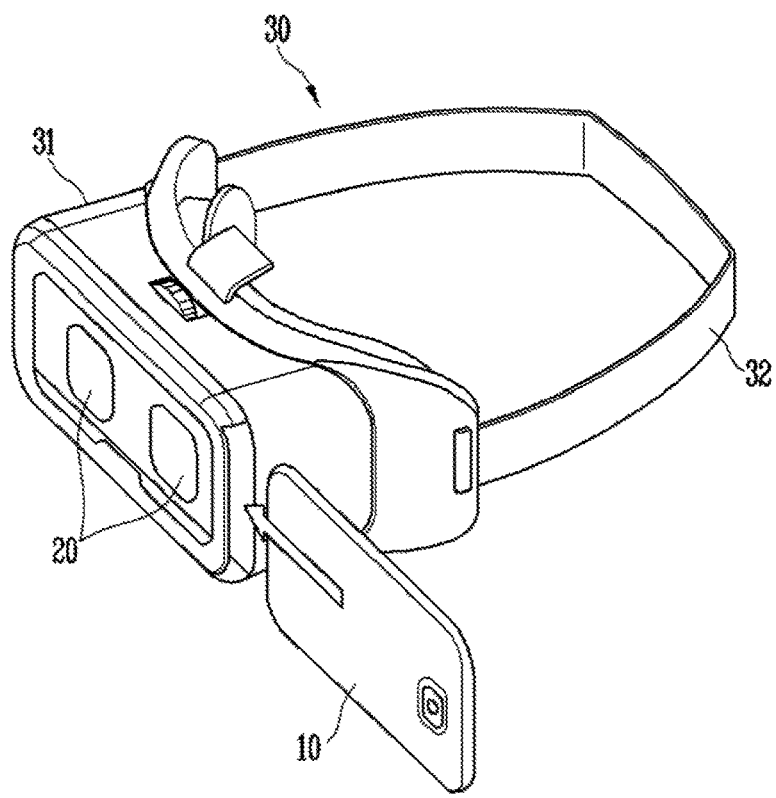
FIGS. 1A-1C are diagrams illustrating a case where a display device, according to an exemplary embodiment of the present disclosure, is mounted on a wearable device.

Hereinafter, exemplary embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
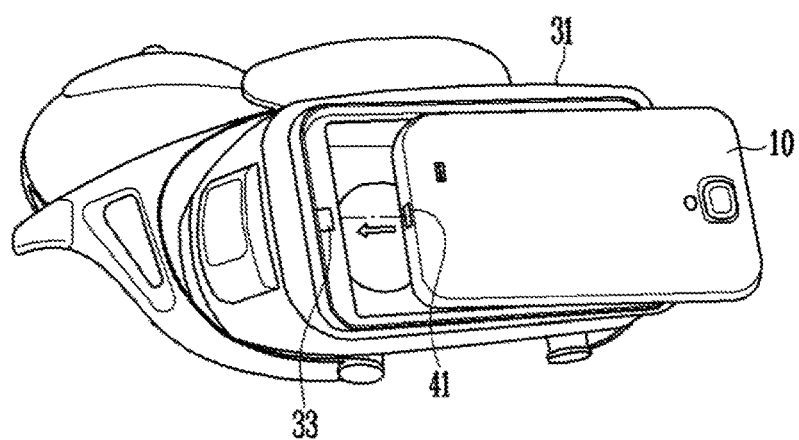
Figure 1C:
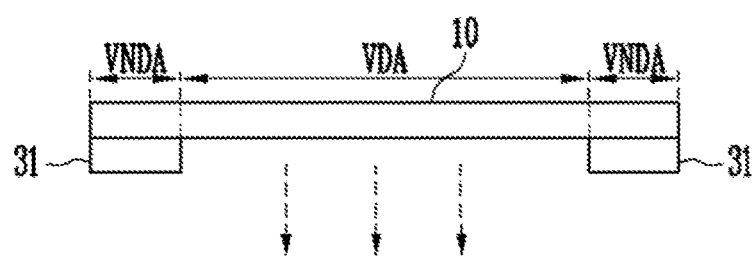

FIGS. 1A through 1C are diagrams illustrating a case where a display device according to an exemplary embodiment of the present disclosure is mounted on a wearable device.

Referring to FIGS. 1A through 1C, a wearable device 30, according to an exemplary embodiment of the present disclosure, may include a frame (e.g., a structural frame) 31.

A band 32 may be connected to the frame 31, and a user may wear the frame 31 on the head by using the band 32. The frame 31 has a structure, in which a display device 10 may be mounted (e.g., detachably mounted).

The display device 10 that is mountable on the wearable device 30 may be, for example, a smart phone.

However, the display device 10, according to one or more exemplary embodiments of the present disclosure, is not limited to the smart phone, and may be any one of suitable electronic devices, for example, such as a tablet PC, an e-book reader, a computer, a workstation, a Personal Digital Assistant (PDA), a Portable Multimedia Player (PMP), and a camera, which are mountable on the wearable device 30 and include a display (e.g., display means).

For example, when the display device 10 is mounted on the frame 31, a connecting part (or portion) 41 of the display device 10 may be electrically connected with a connecting part (or portion) 33 of the frame 31, and thus, the frame 31 and the display device 10 may communicate with each other.

In order to control the display device 10 mounted on the frame 31, the wearable device 30 may include, for example, at least one of a touch sensor, a button, and a wheel key.

When the display device 10 is mounted on the wearable device 30, the display device 10 may be operated as a Head Mounted Display (HMD) device. That is, when the display device 10 is mounted on the wearable device 30, the display device 10 may be driven in a first mode (for example, a Virtual Reality (VR) mode), and when the display device 10 is separated from the wearable device 30, the display device 10 may be driven in a second mode (for example, a normal mode).

When the display device 10 is mounted on the wearable device 30, a driving mode of the display device 10 may be automatically switched to the first mode, or may be switched (e.g., manually switched) to the first mode by a setting of a user.

Further, when the display device 10 is separated from the wearable device 30, a driving mode of the display device 10 may be automatically switched to the second mode, or may be switched (e.g., manually switched) to the second mode by a setting of a user.

The wearable device 30 may include lenses 20 corresponding to both eyes of the user. The lenses 20 may include, for example, a fisheye lens, a wide angle lens, and/or the like, in order to increase a Field Of View (FOV) of the user.

When the display device 10 is mounted on the frame 31, the user may view a display area of the display device 10 through the lenses 20, and thus, the user may view an image as if viewing the image on a large screen from a distance (e.g., a set or predetermined distance).

Referring to FIG. 1C, when the display device 10 is mounted on the wearable device 30, a partial area of the display area may be blocked by the frame 31, so as to display a further improved three-dimensional image to the user.

An area in the display area (e.g., the entire display area) of the display device 10 viewed by the user in response to the first mode is referred to as a view area VDA. Further, an area, which is not viewed by the user during the driving of the display device 10 in the first mode, is referred to as a non-view area VNDA.

In this case, a center (or central area) of the display area corresponding to the positions of the lenses 20 may be the view area VDA, and the other areas (e.g., peripheral areas), except for the center (or central area), may be the non-view area VNDA.

When the display device 10 is driven in the first mode, an image may be displayed on the view area VDA, and an image may not be displayed or a dummy image may be displayed in the non-view area VNDA.

On the other hand, when the display device 10 is driven in the second mode, the entire display area may be viewed by the user. In this case, the image may be displayed on the entire display area.

When the display device 10 is used together with the wearable device 30 as in the exemplary embodiment of the present disclosure, the user may experience various forms of images. However, as described above, the area for displaying the image in the first mode may be different from the area for displaying the image in the second mode, so that when the driving mode of the display device 10 is switched, a boundary line between the view area and the non-view area may appear.

Accordingly, in displaying an image on the display device 10 that is mountable on the wearable device 30, it may be desirable to prevent or reduce the appearance of the boundary line.

Figure 2:
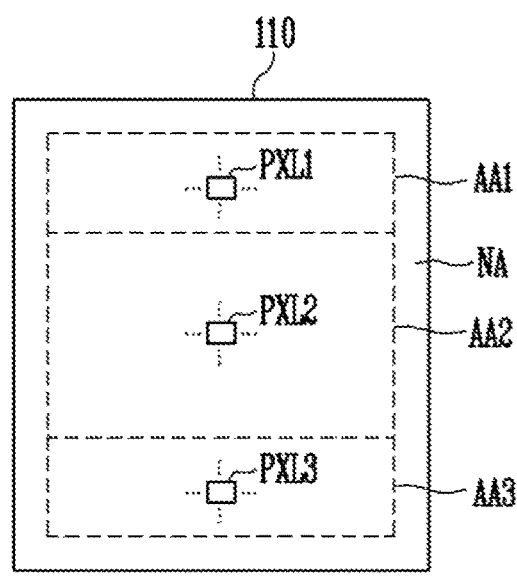
FIG. 2 is a diagram illustrating a pixel area of the display device according to an exemplary embodiment of the present disclosure.

FIG. 2 is a diagram illustrating a pixel area of the display device according to an exemplary embodiment of the present disclosure.

Referring to FIG. 2, the display device 10, according to an exemplary embodiment of the present disclosure, may include pixel areas AA1, AA2, and AA3, and a neighboring area (or a peripheral area) NA. In this case, the pixel areas AA1, AA2, and AA3, and the neighboring area NA may be disposed on a substrate 110.

A plurality of pixels PXL1, PXL2, and PXL3 are positioned in the pixel areas AA1, AA2, and AA3, and thus, the pixel areas AA1, AA2, and AA3 may display an image (e.g., a predetermined image). Accordingly, the pixel areas AA1, AA2, and AA3 may be referred to as display areas.

Constituent elements (for example, wires, etc.) for driving the pixels PXL1, PXL2, PXL3 may be positioned in the neighboring area NA. The pixels PXL1, PXL2, and PXL3 are not present in the neighboring area NA, so that the neighboring area NA may be referred to as a non-display area.

For example, the neighboring area NA may be located at external sides of the pixel areas AA1, AA2, and AA3, and may surround at least a part (or portion) of the pixel areas AA1, AA2, and AA3.

The pixel areas AA1, AA2, and AA3 may include a first pixel area AA1, a second pixel area AA2 at one side of the first pixel area AA1, and a third pixel area AA3 at one side of the second pixel area AA2.

The second pixel area AA2 may be positioned between the first pixel area AA1 and the third pixel area AA3, and the first pixel area AA1 and the third pixel area AA3 may have a smaller area than that of the second pixel area AA2.

In this case, the second pixel area AA2 may correspond to the view area VNDA illustrated in FIG. 1C, and the first pixel area AA1 and the third pixel area AA3 may correspond to the non-view areas VNDA.

That is, when the display device 10 is driven in the first mode, the user may not view an image in the first pixel area AA1 and the third pixel area AA3, and may view an image displayed in the second pixel area AA2.

On the other hand, when the display device 10 is driven in the second mode, the user may view the image (or images) displayed on the first through third pixel areas AA1, AA2, and AA3.

The pixels PXL1, PXL2, and PXL3 may include first pixels PXL1, second pixels PXL2, and third pixels PXL3.

For example, the first pixels PXL1 may be positioned in the first pixel area AA1, the second pixels PXL2 may be positioned in the second pixel area AA2, and the third pixels PXL3 may be positioned in the third pixel area AA3.

The pixels PXL1, PXL2, and PXL3 may emit light with a luminance (e.g., a predetermined luminance) under the control of the drivers, and to this end, each of the pixels PXL1, PXL2, and PXL3 may include an emission device (for example, an organic light emitting diode).

While FIG. 2 illustrates that widths of the first pixel area AA1, the second pixel area AA2, and the third pixel area AA3 are the same or substantially the same, the present disclosure is not limited thereto.

For example, the first pixel area AA1 and/or the third pixel area AA3 may have a shape, in which a width is decreased (e.g., gradually decreased) from the second pixel area AA2.

Alternatively, the first pixel area AA1 and/or the third pixel area AA3 may have a shape, in which a width is smaller than a width of the second pixel area AA2. In this case, the first pixel area AA1 and/or the third pixel area AA3 may be disposed in a vertical direction or a horizontal direction.

The substrate 110 may be formed in various suitable forms on which the pixel areas AA1, AA2, and AA3 may be disposed.

For example, the substrate 110 may be formed of an insulating material, such as glass and/or resin. Further, the substrate 110 may be formed of a material having flexibility, so as to be bendable or foldable, and may have a single-layer structure or a multi-layer structure.

Figure 3:
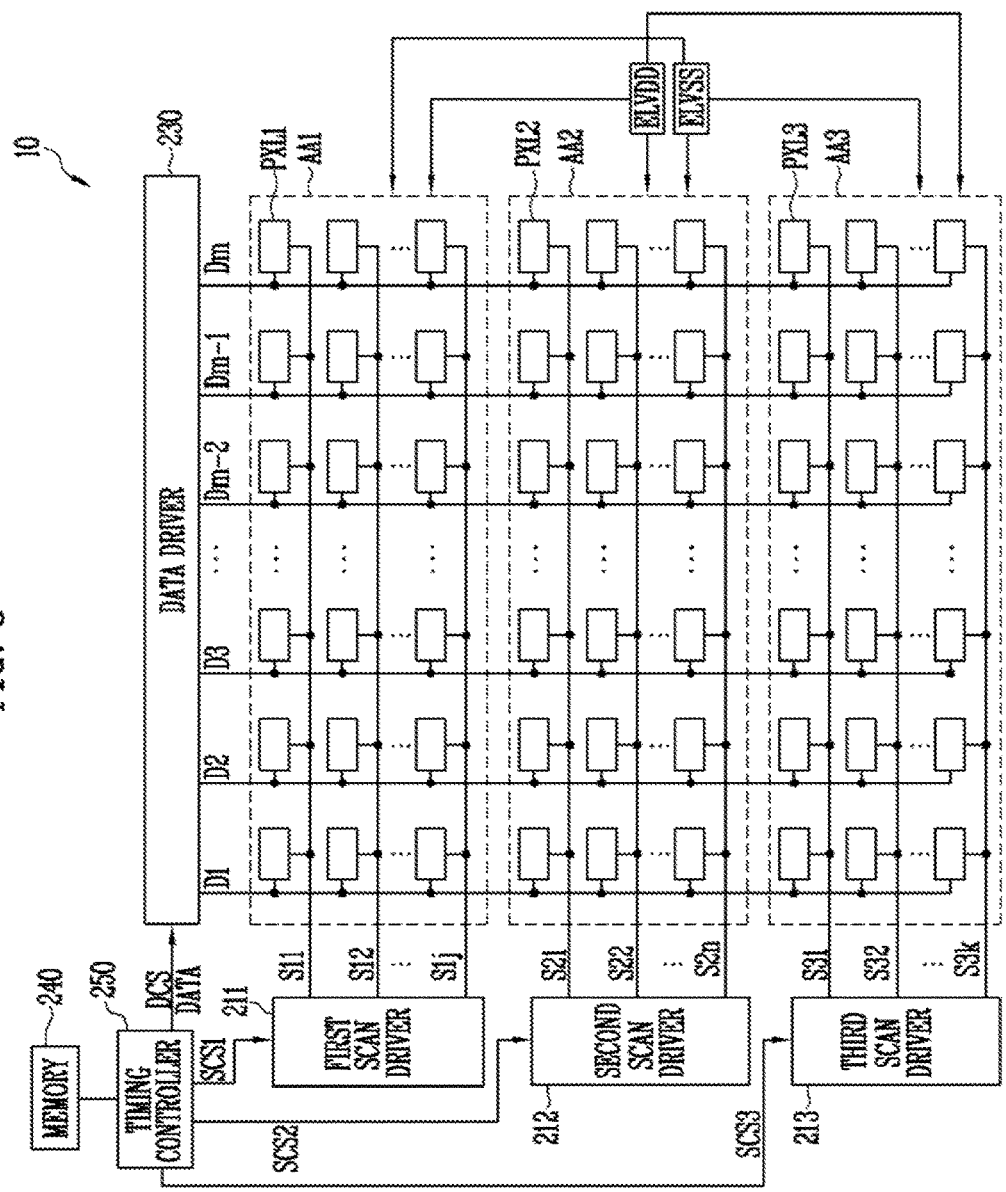
FIG. 3 is a diagram illustrating a configuration of the display device in more detail according to an exemplary embodiment of the present disclosure.

FIG. 3 is a diagram illustrating a configuration of the display device in more detail according to an exemplary embodiment of the present disclosure.

Referring to FIG. 3, the display device 10 according to an exemplary embodiment of the present disclosure may include the first, second, and third pixels PXL1, PXL2, and PXL3, and a display driver.

The display driver may include a first scan driver 211, a second scan driver 212, a third scan driver 213, a data driver 230, memory 240, and a timing controller 250.

The first pixels PXL1 may be located (e.g., positioned) in the first pixel area AA1 that is divided by first scan lines S11 to S1$j$ and data lines D1 to Dm.

The first pixels PXL1 may receive data signals from the data lines D1 to Dm when scan signals are supplied from the first scan lines S11 to S1$j$.

The first pixels PXL1 that receive the data signals may control the quantity of current flowing from a first power source ELVDD to a second power source ELVSS via an organic light emitting diode, and in this case, the organic light emitting diode may generate light of luminance corresponding to the quantity of current.

The second pixels PXL2 may be located in the second pixel area AA2 that is divided by second scan lines S21 to S2$n$ and data lines D1 to Dm.

The second pixels PXL2 may receive data signals from the data lines D1 to Dm when scan signals are supplied from the second scan lines S21 to S2$n$.

The second pixels PXL2 that receive the data signals may control the quantity of current flowing from the first power source ELVDD to the second power source ELVSS via an organic light emitting diode, and in this case, the organic light emitting diode may generate light of luminance corresponding to the quantity of current.

The third pixels PXL3 may be located in the third pixel area AA3 that is divided by third scan lines S31 to S3$k$ and the data lines D1 to Dm.

The third pixels PXL3 may receive data signals from the data lines D1 to Dm when scan signals are supplied from the third scan lines S31 to S3$k$.

The third pixels PXL3 that receive the data signals may control the quantity of current flowing from the first power source ELVDD to the second power source ELVSS via an organic light emitting diode, and in this case, the organic light emitting diode may generate light of luminance corresponding to the quantity of current.

For example, the first pixel area AA1 and the third pixel area AA3 may have smaller areas than an area of the second pixel area AA2.

In this case, the number of first pixels PXL1 and the number of third pixels PXL3 may be less than the number of the second pixels PXL2, and the number of first scan lines S11 to S1$j$ and the number of third scan lines S31 to S3$k$ may be less than the number of the second scan lines S21 to S2$n$.

When the display device 10 is driven in the second mode, images may be displayed in the first pixel area AA1, the second pixel area AA2, and the third pixel area AA3. That is, the user may view the images displayed in the first pixel area AA1, the second pixel area AA2, and the third pixel area AA3.

When the display device 10 is driven in the first mode, an image is displayed in the second pixel area AA2, and the first pixel area AA1 and the third pixel area AA3 may be hidden by the frame 31 of the wearable device 30.

When the display device 10 is driven in the first mode, the first pixel area AA1 and the third pixel area AA3 may correspond to areas which may not be viewed by the user, so that a method of stopping an image display operation at the first pixel area AA1 and the third pixel area AA3 may be desired.

To this end, the scan signals may not be supplied to the first scan lines S11 to S1$j$ and the third scan lines S31 to S3$k$ connected to the first pixels PXL1 and the third pixels PXL3, and data signals (e.g., separate data signals) may not be supplied to the first pixels PXL1 and the third pixels PXL3.

However, when the first pixels PXL1 and the third pixels PXL3 are not driven during the driving of the second pixels PXL2, characteristics of the driving transistors included in the first pixels PXL1 and the third pixels PXL3 may be different from characteristics of the driving transistors included in the second pixels PXL2. In this case, when the operation mode changes from the first mode to the second mode, a luminance variation (or deviation) may be generated between the second pixel area AA2 and the first and third pixel areas AA1 and AA3 according to a characteristic variation (or deviation) of the driving transistor in each of the pixel areas AA1, AA2, and AA3. Further, boundary lines between the first pixel area AA1 and the second pixel area AA2, and between the second pixel area AA2 and the third pixel area AA3 may be viewed.

According to an exemplary embodiment of the present disclosure, when the display device 10 is driven in the first mode, the display device 10 may drive the first pixels PXL1 and the third pixels PXL3 by supplying scan signals and data signals (for example, dummy data signals) to the first pixels PXL1 and the third pixels PXL3, thereby reducing or preventing the boundary lines from displaying by the characteristic variation (or deviation) of the driving transistors.

The first scan driver 211 may supply first scan signals to the first scan lines S11 to S1$j$ in response to a first scan driver control signal SCS1 from the timing controller 250.

For example, the first scan driver 211 may sequentially supply the first scan signals to the first scan lines S11 to S1$j$. When the first scan signals are sequentially supplied to the first scan lines S11 to S1$j$, the first pixels PXL1 may be sequentially selected in the unit of a horizontal line.

The second scan driver 212 may supply second scan signals to the second scan lines S21 to S2$n$ in response to a second scan driver control signal SCS2 from the timing controller 250.

For example, the second scan driver 212 may sequentially supply the second scan signals to the second scan lines S21 to S2$n$. When the second scan signals are sequentially supplied to the second scan lines S21 to S2$n$, the second pixels PXL2 may be sequentially selected in the unit of the horizontal line.

The third scan driver 213 may supply third scan signals to the third scan lines S31 to S3$k$ in response to a third scan driver control signal SCS3 from the timing controller 250.

For example, the third scan driver 213 may sequentially supply the third scan signals to the third scan lines S31 to S3$k$. When the third scan signals are sequentially supplied to the third scan lines S31 to S3$k$, the third pixels PXL3 may be sequentially selected in the unit of the horizontal line.

In this case, the first scan signal, the second scan signal, and the third scan signal may have a voltage at which a corresponding transistor (e.g., a switching transistor) may be turned on.

That is, when the display device 10 is driven in each of the first mode or the second mode, the first pixels PXL1, the second pixels PXL2, and the third pixels PXL3 may be sequentially selected in the unit of the horizontal line for each frame period.

The display driver according to an exemplary embodiment of the present disclosure may further include memory 240.

The memory 240 according to an exemplary embodiment of the present disclosure may perform a function of storing the dummy data signals, which are to be supplied to the first pixels PXL1 and the third pixels PXL3, when the display device 10 is driven in the first mode.

In more detail, first data signals, which have been supplied to the second pixels (for example, the second pixels PXL2 connected to a first second scan line S21) adjacent to the first pixel area AA1 from among the second pixels PXL2, in a previous frame may be stored in the memory 240. In this case, the stored first data signals may be supplied to the first pixels PXL1 in a current frame when driven in the first mode.

Further, second data signals, which have been supplied to the second pixels (for example, the second pixels PXL2 connected to a last second scan line S2$n$) adjacent to the third pixel area AA3 from among the second pixels PXL2, in the previous frame may be stored in the memory 240. In this case, the stored second data signals may be supplied to the third pixels PXL3 in the current frame when driven in the first mode.

The data driver 230 may supply data signals to the data lines D1 to Dm in response to a data control signal DCS.

The data signals supplied to the data lines D1 to Dm may be supplied to the pixels PXL1, PXL2, and PXL3, which are selected by the scan signals, respectively.

The timing controller 250 may supply the scan driver control signals SCS1, SCS2, and SCS3 that are generated based on timing signals supplied from the outside to the scan drivers 211, 212, and 213.

The timing controller 250 may supply the data control signal DCS to the data driver 230. Further, the timing controller 250 may convert image data input from the outside into image data DATA based on satisfying a specification of the data driver 230, and may supply the converted image data DATA to the data driver 230.

The first scan driver control signal SCS1 may include a first start signal and clock signals. The first start signal may control supply timings of the first scan signals, and the clock signals may be used for shifting the first start signal.

The second scan driver control signal SCS2 may include clock signals. The clock signals may be used for shifting the first scan signal supplied to a last first scan line S1$j$.

The third scan driver control signal SCS3 may include clock signals. The clock signals may be used for shifting the second scan signal supplied to a last second scan line S2$n$.

For example, the clock signals included in the first to third scan driver control signals SCS1 to SCS3 may be the same signals.

The data control signal DCS may include a source start signal, a source output enable signal, a source sampling clock, and the like. The source start signal may control a data sampling start time of the data driver 230. The source sampling clock may control a sampling operation of the data driver 230 based on a rising or falling edge. The source output enable signal may control an output timing of the data driver 230.

FIG. 3 separately illustrates the scan drivers 211, 212, and 213, the data driver 230, the memory 240, and the timing controller 250, but at least a part (or portion) of the constituent elements may be combined, if desired.

Further, the scan drivers 211, 212, and 213, the data driver 230, the memory 240, and the timing controller 250 may be installed by various methods, such as Chip On Glass, Chip On Plastic, Tape Carrier Package, and/or Chip On Film.

Figure 4:
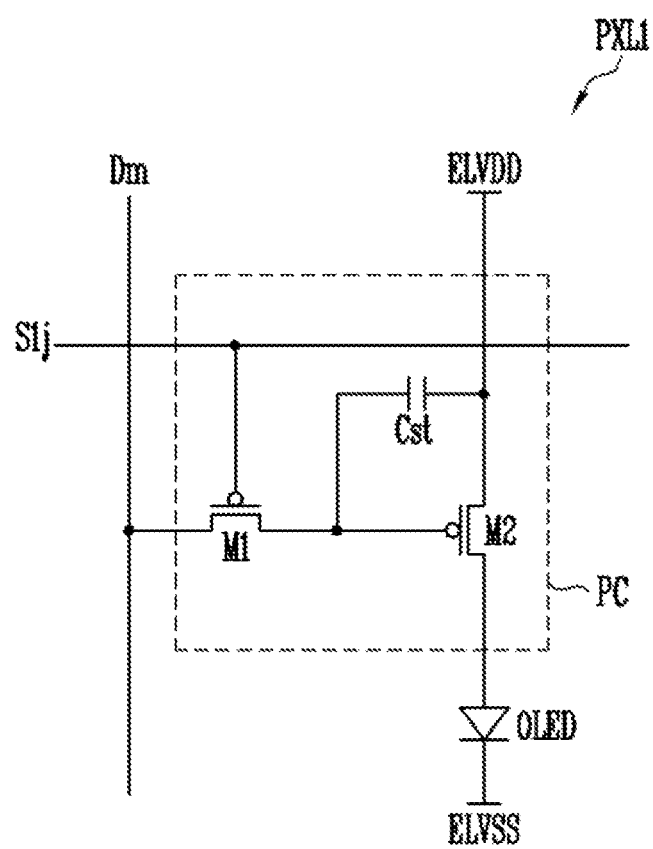
FIG. 4 is a diagram illustrating an exemplary embodiment of one of the first pixels illustrated in FIG. 3.

FIG. 4 is a diagram illustrating an exemplary embodiment of one of the first pixels illustrated in FIG. 3. For convenience of description, FIG. 4 illustrates the first pixel PXL1 connected to the $j^{th}$ first scan line S1$j$ and the $m^{th}$ data line Dm.

Referring to FIG. 4, the first pixel PXL1 includes an organic light emitting diode OLED, and a pixel circuit PC connected to the $m^{th}$ data line Dm and the $j^{th}$ first scan line S1$j$ to control the organic light emitting diode OLED.

An anode electrode of the organic light emitting diode OLED may be connected to the pixel circuit PC, and a cathode electrode of the organic light emitting diode OLED may be connected to the second power source ELVSS.

The organic light emitting diode OLED may generate light with a brightness (e.g., a predetermined brightness) in response to a current supplied from the pixel circuit PC.

The pixel circuit PC may store the data signal supplied to the $m^{th}$ data line Dm when the scan signal is supplied to the $j^{th}$ first scan line S1$j$, and may control the quantity of current supplied to the organic light emitting diode OLED in response to the stored data signal.

For example, the pixel circuit PC may include a first transistor M1, a second transistor M2, and a storage capacitor Cst.

The first transistor M1 may be connected between the $m^{th}$ data line Dm and the second transistor M2.

For example, a gate electrode of the first transistor M1 may be connected to the $j^{th}$ first scan line S1$j$, a first electrode of the first transistor M1 may be connected to the $m^{th}$ data line Dm, and a second electrode of the first transistor M1 may be connected to a gate electrode of the second transistor M2.

The first transistor M1 may be turned on when the scan signal is supplied from the $j^{th}$ first scan line S1$j$, to supply the data signal from the $m^{th}$ data line Dm to the storage capacitor Cst.

In this case, the storage capacitor Cst may charge a voltage corresponding to the data signal.

The second transistor M2 may be connected between the first power source ELVDD and the organic light emitting diode OLED.

For example, a gate electrode of the second transistor M2 may be connected to a first electrode of the storage capacitor Cst and the second electrode of the first transistor M1, a first electrode of the second transistor M2 may be connected to a second electrode of the storage capacitor Cst and the first power source ELVDD, and a second electrode of the second transistor M2 may be connected to the anode electrode of the organic light emitting diode OLED.

The second transistor M2, which serves as a driving transistor, may control the quantity of current flowing from the first power source ELVDD to the second power source ELVSS via the organic light emitting diode OLED, in response to a voltage value of the voltage stored in the storage capacitor Cst.

In this case, the organic light emitting diode OLED may generate light corresponding to the quantity of current supplied from the second transistor M2.

Here, the first electrodes of the transistors M1 and M2 may be any one of a source electrode and a drain electrode, and the second electrodes of the transistors M1 and M2 may be a different electrode from the first electrode. For example, when the first electrode is a source electrode, the second electrode may be a drain electrode.

Further, FIG. 4 illustrates the case where the transistors M1 and M2 are PMOS transistors as an example, but in another exemplary embodiment, the transistors M1 and M2 may be implemented with NMOS transistors or may be implemented with suitable transistors that are different from each other.

However, the pixel structure illustrated in FIG. 4 is simply one exemplary embodiment of the present disclosure, and thus, the first pixel PXL1 of the present disclosure is not limited to the pixel structure shown in FIG. 4. For example, the pixel PXL1 may have a structure that is similar to or the same as any one of various suitable pixel structures capable of supplying a current to the organic light emitting diode OLED.

The first power source ELVDD may be a high potential power source, and the second power source ELVSS may be a low potential power source.

For example, the first power source ELVDD may have a positive voltage, and the second power source ELVSS may have a negative voltage or ground (e.g., a ground voltage).

Each of the other first pixels PXL1, the second pixels PXL2, and the third pixels PXL3 may be implemented with the same or substantially the same circuit as that of the first pixel PXL1 as described with reference to FIG. 4. Accordingly, detailed descriptions of the other first pixels PXL1, the second pixels PXL2, and the third pixels PXL3 may be omitted.

Figure 5:
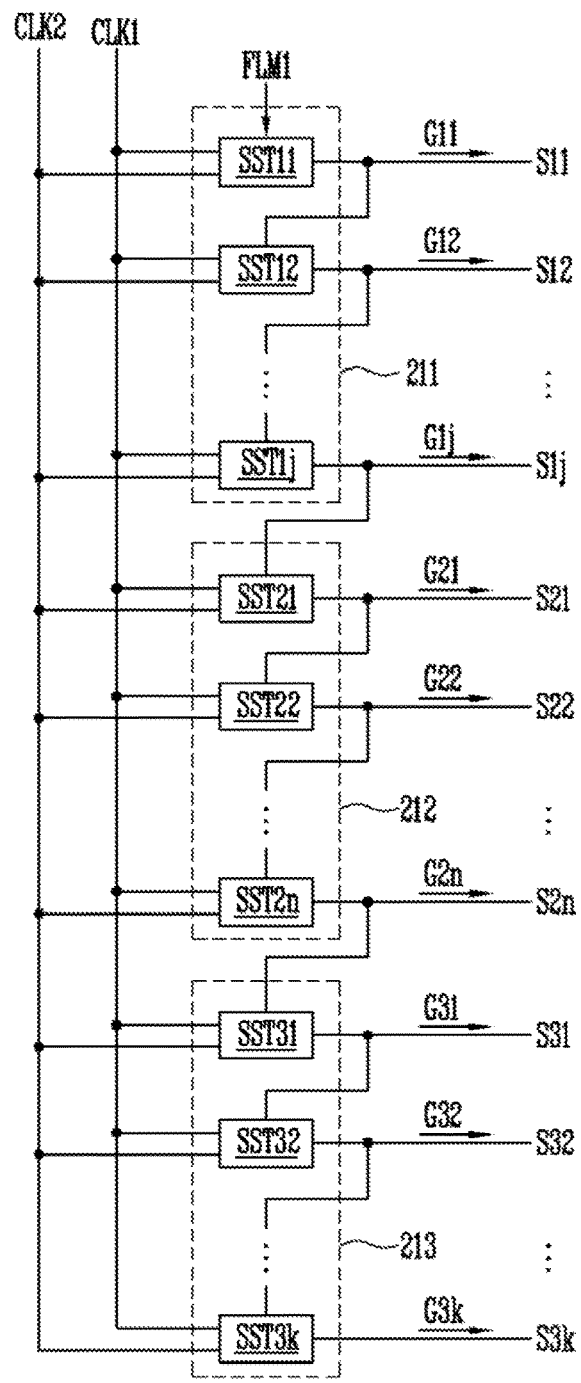
FIG. 5 is a diagram illustrating scan drivers illustrated in FIG. 3 in more detail.

FIG. 5 is a diagram illustrating the scan drivers illustrated in FIG. 3 in more detail.

Referring to FIG. 5, the first scan driver 211 may include a plurality of first scan stage circuits SST11 to SST1$j$.

The first scan stage circuits SST11 to SST1$j$ may be connected to one ends of the first scan lines S11 to S1$j$, respectively. The first scan stage circuits SST11 to SST1$j$ may supply first scan signals G11 to G1$j$ to the first scan lines S11 to S1$j$, respectively.

In this case, the first scan stage circuits SST11 to SST1$j$ may be operated in response to clock signals CLK1 and CLK2 supplied from the timing controller 250. Further, each of the first scan stage circuits SST11 to SST1$j$ may be implemented with the same or substantially the same circuit structure as each other.

The first scan stage circuits SST11 to SST1$j$ may receive output signals (that is, the scan signals) of previous scan stage circuits or a first start signal FLM1.

For example, the first first scan stage circuit SST11 may receive the first start signal FLM1, and the other first scan stage circuits SST12 to SST1$j$ may receive output signals of a corresponding previous scan stage circuit.

The second scan stage circuits SST21 to SST2$n$ may be connected to one ends of the second scan lines S21 to S2$n$, respectively. The second scan stage circuits SST21 to SST2$n$ may supply second scan signals G21 to G2$n$ to the second scan lines S21 to S2$n$, respectively.

In this case, the second scan stage circuits SST21 to SST2$n$ may be operated in response to the clock signals CLK1 and CLK2 supplied from the timing controller 250. Further, each of the second scan stage circuits SST21 to SST2$n$ may be implemented with the same or substantially the same circuit structure as each other.

Each of the second scan stage circuits SST21 to SST2$n$ may receive an output signal of a corresponding previous stage circuit.

For example, the first second scan stage circuit SST21 may use a signal G1$j$ output from the last first scan stage circuit SST1$j$ of the first scan driver 211 as a start signal, and the other second scan stage circuits SST22 to SST2$n$ may receive an output signal of a corresponding previous scan stage circuit.

Further, the last scan stage circuit SST2$n$ of the second scan driver 212 may supply the output signal to the first third scan stage circuit SST31 of the third scan driver 213.

The third scan stage circuits SST31 to SST3$k$ may be connected to one ends of the third scan lines S31 to S3$k$, respectively. The third scan stage circuits SST1 to SST3$k$ may supply third scan signals G31 to G3$k$ to the third scan lines S31 to S3$k$, respectively.

In this case, the third scan stage circuits SST31 to SST3$k$ may be operated in response to the clock signals CLK1 and CLK2 supplied from the timing controller 250. Further, each of the third scan stage circuits SST31 to SST3$k$ may be implemented with the same or substantially the same circuit structure as each other.

Each of the third scan stage circuits SST31 to SST3$k$ may receive an output signal of a corresponding previous stage circuit.

For example, the first third scan stage circuit SST31 may use a signal G2$n$ output from the last second scan stage circuit SST2$n$ of the second scan driver 212 as a start signal, and the other third scan stage circuits SST32 to SST3k may receive an output signal of a corresponding previous scan stage circuit.

The number of pulses included in each of the scan signals G11 to G1j, G21 to G2n, and G31 to G3k may be determined in response to a width of the first start signal FLM1. That is, as the width of the first start signal FLM1 is increased, each of the scan signals G11 to G1j, G21 to G2n, and G31 to G3k may include a larger number of pulses. The width of the first start signal FLM1 may be variously determined (or set) according to a driving method.

Figure 6B:
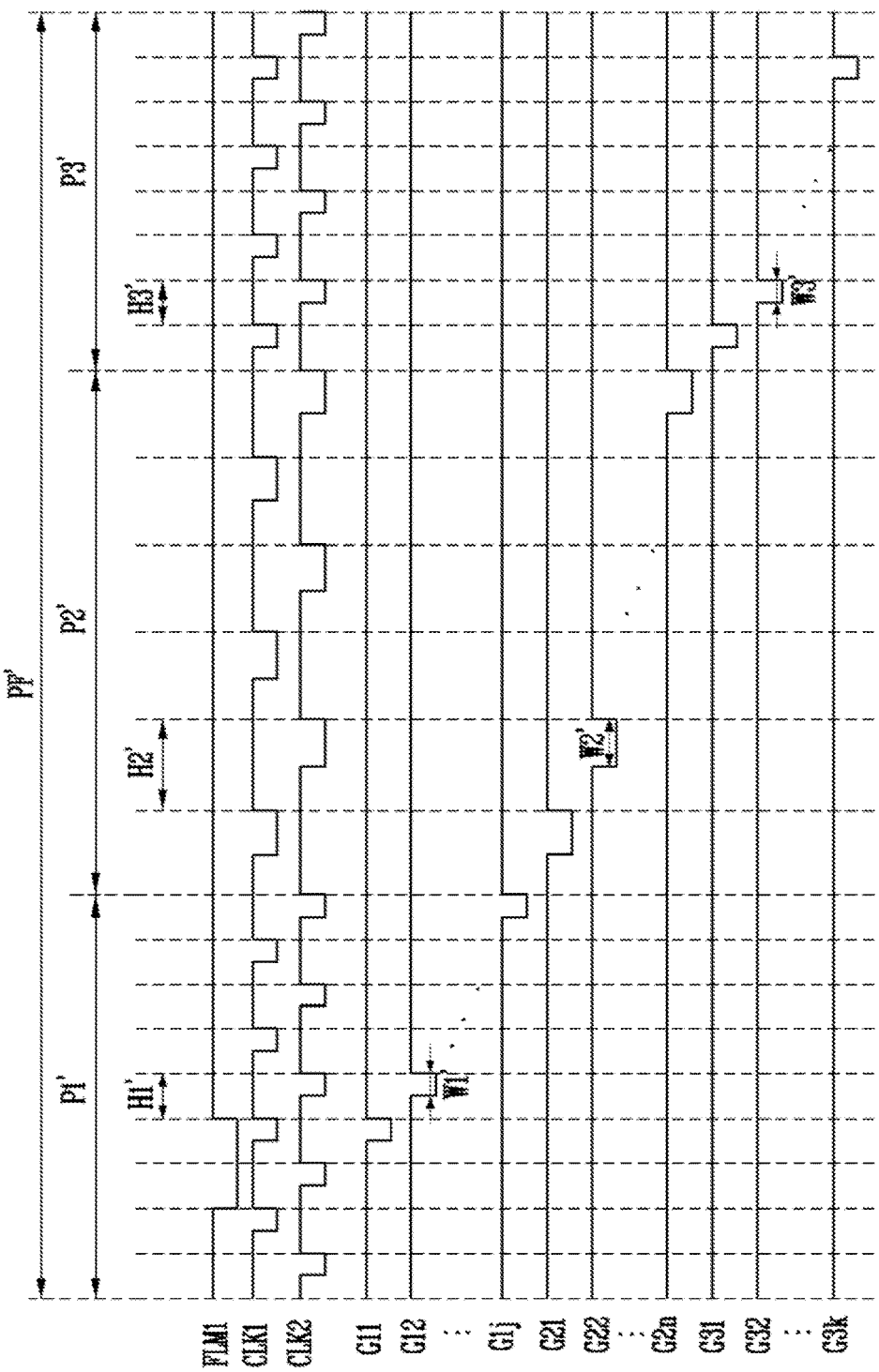

FIGS. 6A and 6B are waveform diagrams for describing a driving method of the display device according to an exemplary embodiment of the present disclosure. In more detail, FIG. 6A illustrates one frame period PF when the display device is driven in the second mode, and FIG. 6B illustrates one frame period PF' when the display device is driven in the first mode.

Referring to FIG. 6A, the one frame period PF of the second mode may include a first period P1, during which the first scan signals G11 to G1j are supplied, a second period P2, during which the second scan signals G21 to G2n are supplied, and a third period P3, during which the third scan signals G31 to G3k are supplied.

The first scan driver 211 starts the supply of the first scan signals G11 to G1j in response to the supply of the first start signal FLM1, and the second scan driver 212 and the third scan driver 213 may sequentially start the supply of the second scan signals G21 to S2n and the third scan signals G31 to G3k, respectively.

For example, the first scan driver 211 may sequentially supply the first scan signals G11 to G1j during the first period P1, the second scan driver 212 may sequentially supply the second scan signals G21 to G2n during the second period P2, and the third scan driver 213 may sequentially supply the third scan signals G31 to G3k during the third period P3.

In this case, each of the first scan signals G11 to G1j may have a first pulse width W1, each of the second scan signals G21 to G2n may have a second pulse width W2, and each of the third scan signals G31 to G3k may have a third pulse width W3.

Further, the first period P1 may include a plurality of first horizontal periods H1, the second period P2 may include a plurality of second horizontal periods H2, and the third period P3 may include a plurality of third horizontal periods H3.

The second mode corresponds to a normal mode, so that the first pulse width W1, the second pulse width W2, and the third pulse width W3 may be the same or substantially the same with each other, and the lengths (or widths) of the first horizontal period H1, the second horizontal period H2, and the third horizontal period H3 may be the same or substantially the same with each other.

In order to set the first pulse width W1, the second pulse width W2, and the third pulse width W3 to be the same or substantially the same, the widths of the clock signals CLK1 and CLK2 that are supplied for each of the periods P1, P2, and P3 may be the same or substantially the same.

The first mode may correspond to a VR mode, for example, so that the first mode may display an image with a higher frame frequency than that of the second mode.

When the frame frequency is increased, the pulse width of the scan signals is decreased. When the pulse width of the scan signals is decreased, a charging rate of the data signal may be influenced, and thus, may degrade a display quality. That is, according to the decrease in the pulse width W2 of the second scan signals G21 to G2n, a quality of an image displayed in the second pixel area AA2 in the first mode may be degraded.

Accordingly, in an exemplary embodiment of the present disclosure, a display quality may be improved by increasing the pulse widths W2 of the second scan signals G21 to G2n for the second pixel area AA2, at which the image (e.g., the viewable image) is displayed in the first mode.

To this end, as illustrated in FIG. 6B, a first pulse width W1' of the first scan signals G11 to G1j may be different from a second pulse width W2' of the second scan signals G21 to G2n when the display device is driven in the first mode.

Further, a third pulse width W3' of the third scan signals G31 to G3k may be different from the second pulse width W2' of the second scan signals G21 to G2n when the display device is driven in the first mode.

For example, the first pulse width W1' may be smaller than the second pulse width W2', and the third pulse width W3' may be smaller than the second pulse width W2'.

Further, according to the decrease in the first pulse width W1' and the third pulse width W3', lengths of the first period P1' and the third period P3' may also be decreased, and thus, a length of the second period P2' may be increased by the decreased amounts of the lengths of the first period P1' and the third period P3'. Accordingly, the second pulse width W2' may also be increased when compared to existing driving methods.

As a result, the second pulse width W2' of the second scan signals G21 to G2n may be increased, and as a result, a display quality of the second pixel area AA2 may be improved.

As described above, in order to set the first pulse width W1', the second pulse width W2', and the third pulse width W3', the widths of the clock signals CLK1 and CLK2 supplied during each of the periods P1', P2', and P3' may be changed.

For example, the widths of the clock signals CLK1 and CLK2 during the first period P1' may be the same or substantially the same as the first pulse width W1', the widths of the clock signals CLK1 and CLK2 during the second period P2' may be the same or substantially the same as the second pulse width W2', and the widths of the clock signals CLK1 and CLK2 during the third period P3' may be the same or substantially the same as the third pulse width W3'.

Further, according to the decrease of the lengths of the first period P1' and the third period P3', the lengths (or widths) of the first horizontal periods H1' and the third horizontal periods H3' may also be decreased, and according to the increase of the length of the second period P2', the length (or width) of the second horizontal periods H2' may be increased.

Accordingly, the lengths (or widths) of the first horizontal periods H1' and the third horizontal periods H3' may be less than that of the second horizontal periods H2'.

The lengths (or widths) of the first horizontal periods H1 and H1', the second horizontal periods H2 and H2', and the third horizontal periods H3 and H3' may be controlled by the timing controller 250.

Further, the first pulse width W1' and the third pulse width W3' may be equal to or substantially equal to each other, or may be different from each other, and the length (or width) of the first horizontal periods H1' and the length (or width) of the third horizontal periods H3' may be the same or substantially the same as each other, or may be different from each other.

Figure 7A:
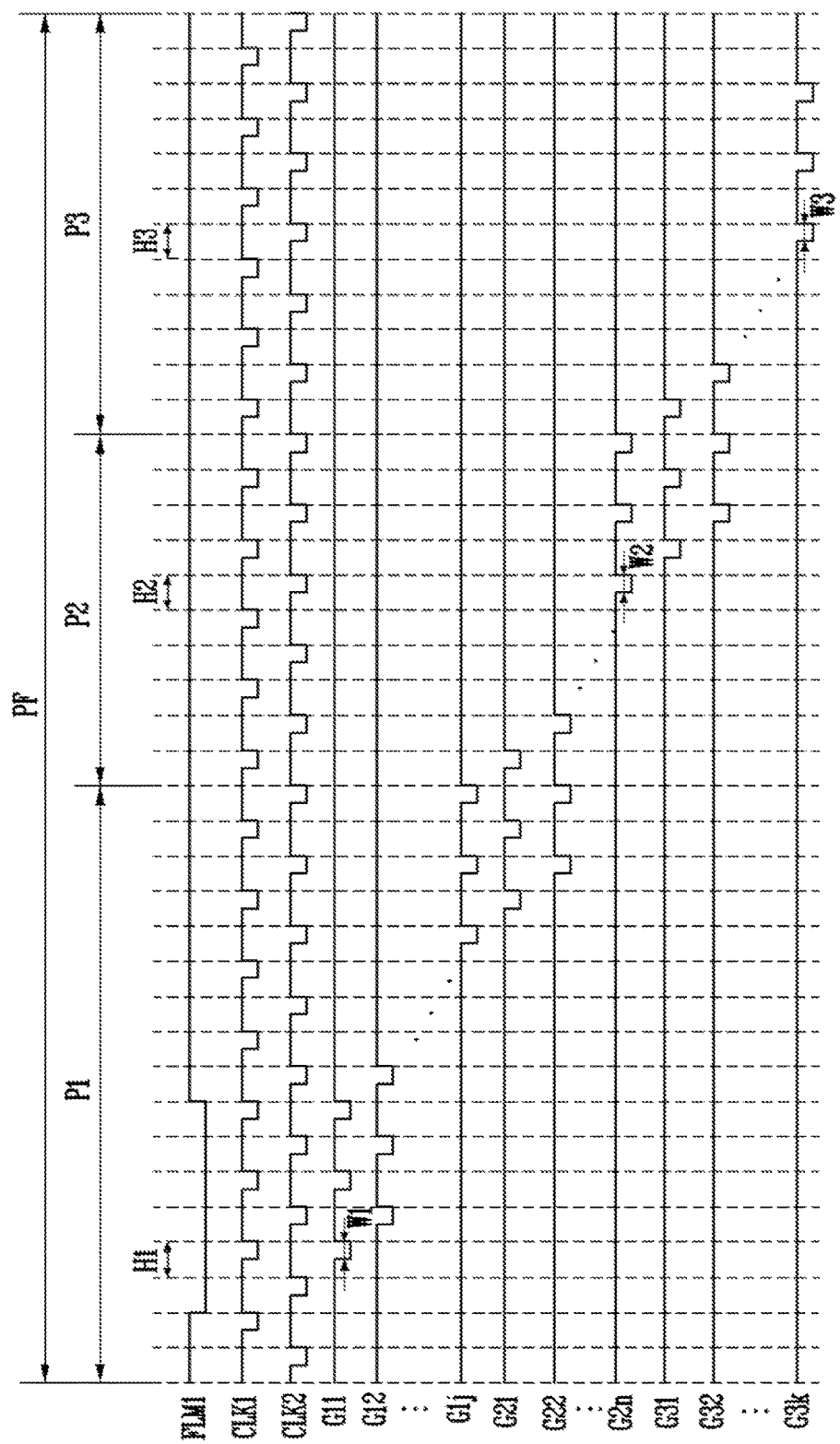
FIGS. 7A and 7B are waveform diagrams for describing a driving method of the display device according to another exemplary embodiment of the present disclosure.
Figure 7B:
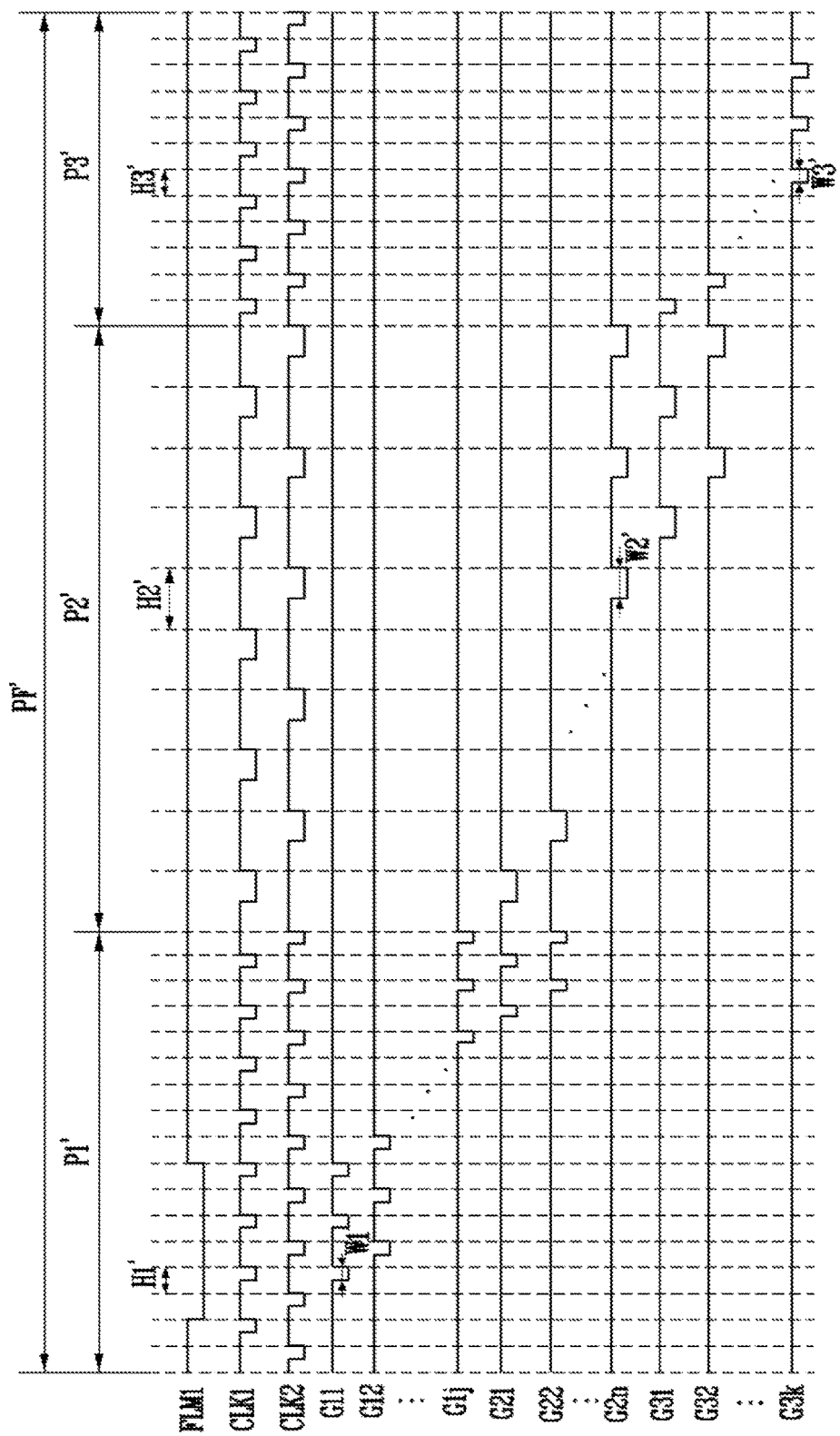

FIGS. 7A and 7B are waveform diagrams for describing a driving method of the display device according to another exemplary embodiment of the present disclosure. In more detail, FIG. 7A illustrates one frame period PF when the display device is driven in the second mode, and FIG. 7B illustrates one frame period PF' when the display device is driven in the first mode. Further, FIGS. 6A and 6B illustrate the case where each of the scan signals G11 to G1$j$, G21 to G2$n$, G31 to G3$k$ includes only one pulse, but FIGS. 7A and 7B illustrate the case where each of the scan signals G11 to G1$j$, G21 to G2$n$, G31 to G3$k$ includes a plurality of pulses.

Hereinafter, differences in comparison of the aforementioned exemplary embodiments will be mainly described, and the same or substantially the same description between the aforementioned exemplary embodiments may not be repeated.

Referring to FIG. 7A, when the display device is driven in the second mode, a first pulse width W1 of the first scan signals G11 to G1$j$, a second pulse width W2 of the second scan signals G21 to G2$n$, and a third pulse width W3 of the third scan signals G31 to G3$k$ may be the same or substantially the same as each other.

Further, when the display device is driven in the second mode, the first horizontal periods H1 of the first period P1, the second horizontal periods H2 of the second period P2, and the third horizontal periods H3 of the third period P3 may have the same or substantially the same lengths as each other.

Referring to FIG. 7B, a first pulse width W1' of the first scan signals G11 to G1$j$ may be different from a second pulse width W2' of the second scan signals G21 to G2$n$ when the display device is driven in the first mode.

Further, a third pulse width W3' of the third scan signals G31 to G3$k$ may be different from the second pulse width W2' of the second scan signals G21 to G2$n$ when the display device is driven in the first mode.

For example, the first pulse width W1' may be smaller than the second pulse width W2', and the third pulse width W3' may be smaller than the second pulse width W2'.

However, each of the scan signals G11 to G1$j$, G21 to G2$n$, and G31 to G3$k$ include the plurality of pulses, so that the pulses included in some scan signals may have different widths.

For example, in the case of the first second scan signal G21, two of the pulses at the beginning (or front) from among three pulses may have the same or substantially the same width as the first pulse width W1', and one pulse at the end (or rear) from among the three pulses may have the second pulse width W2'. Similarly, the pulses included in the second second scan signal G22 may also have different widths.

Further, in the case of the first third scan signal G31, two pulses at the beginning (or front) from among three pulses may have the same or substantially the same width as the second pulse width W2', and one pulse at the end (or rear) from among the three pulses may have the third pulse width W3'. Similarly, the pulses included in the second third scan signal G32 may also have different widths.

FIGS. 7A and 7B illustrate cases where each of the scan signals G11 to G1$j$, G21 to G2$n$, and G31 to G3$k$ includes three pulses as an example, but the present disclosure is not limited thereto, and the number of pulses included in each of the scan signals G11 to G1$j$, G21 to G2$n$, and G31 to G3$k$ may be variously changed.

Figure 8:
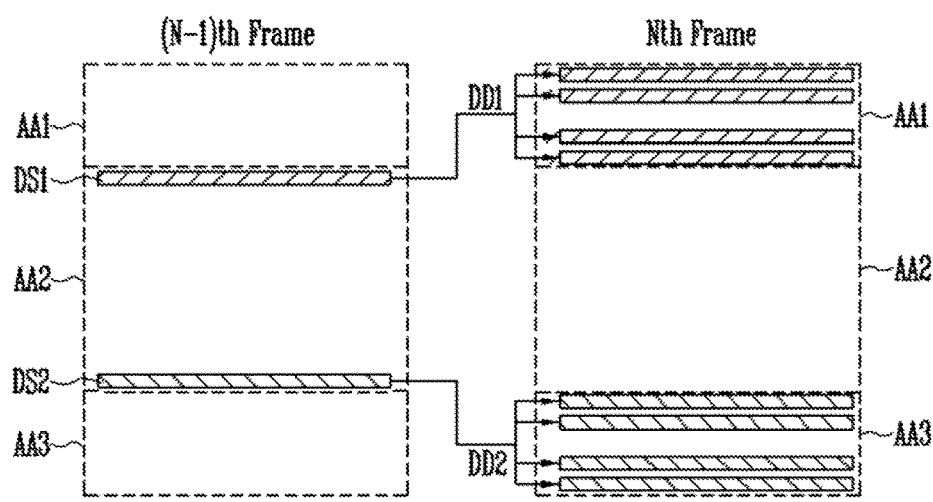
FIG. 8 is a diagram for describing an image display operation of a first pixel area and a third pixel area when the display device is driven in a first mode according to an exemplary embodiment of the present disclosure.

FIG. 8 is a diagram for describing an image display operation of the first pixel area and the third pixel area when the display device is driven in the first mode according to an exemplary embodiment of the present disclosure.

Referring to FIG. 8, each horizontal line of the first pixel area AA1 may display the same or substantially the same image when the display device is driven in the first mode.

In this case, each of the horizontal lines of the first pixel area AA1 may include one row of the first pixels PXL1, and each of the pixel rows formed of the first pixels PXL1 may receive the same or substantially the same data signal.

For example, the data driver 230 may synchronize the dummy data signal that is stored in the memory 240 to the first scan signals G11 to G1$j$, and may supply the synchronized data signals to the first pixels PXL1.

In this case, in order to minimize or reduce a view to a user of a boundary between the first pixel area AA1 and the second pixel area AA2, each horizontal line of the first pixel area AA1 for a current frame (e.g, an $N^{th}$ frame) may display the same or substantially the same image as an image displayed in a first horizontal line of the second pixel area AA2 during a previous frame (e.g., an $(N-1)^{th}$ frame).

To this end, first data signals DS1, which have been supplied to the second pixels (for example, the second pixels PXL2 connected to the first second scan line S21) adjacent to the first pixel area AA1 from among the second pixels PXL2 during a previous frame (e.g., the $(N-1)^{th}$ frame), may be stored in the memory 240. In this case, the stored first data signals DS1, which are first dummy data signals DD1, may be supplied to each of the pixel rows formed of the first pixels PXL1 during the current frame (e.g., the $N^{th}$ frame).

In addition, each horizontal line of the third pixel area AA3 may display the same image when the display device is driven in the first mode.

In this case, each of the horizontal lines of the third pixel area AA3 may include one row of the third pixels PXL3, and each of the pixel rows formed of the third pixels PXL3 may receive the same or substantially the same data signal.

For example, the data driver 230 may synchronize the dummy data signal that is stored in the memory 240 to the third scan signals G31 to G3$k$, and may supply the synchronized data signals to the third pixels PXL3.

In this case, in order to minimize or reduce a view to a user of a boundary between the second pixel area AA2 and the third pixel area AA3, each horizontal line of the third pixel area AA3 for a current frame (e.g., an $N^{th}$ frame) may display the same or substantially the same image as an image displayed in the last horizontal line of the second pixel area AA2 during a previous frame (e.g., an $(N-1)^{th}$ frame).

To this end, second data signals DS2, which have been supplied to the second pixels (for example, the second pixels PXL2 connected to the last second scan line S2$n$) adjacent to the third pixel area AA3 from among the second pixels PXL2 during a previous frame (e.g., the $(N-1)^{th}$ frame), may be stored in the memory 240. In this case, the stored second data signals DS2, which are second dummy data signal DD2, may be supplied to each of the pixel rows formed of the third pixels PXL3 during the current frame (e.g., the $N^{th}$ frame).

Figure 9:
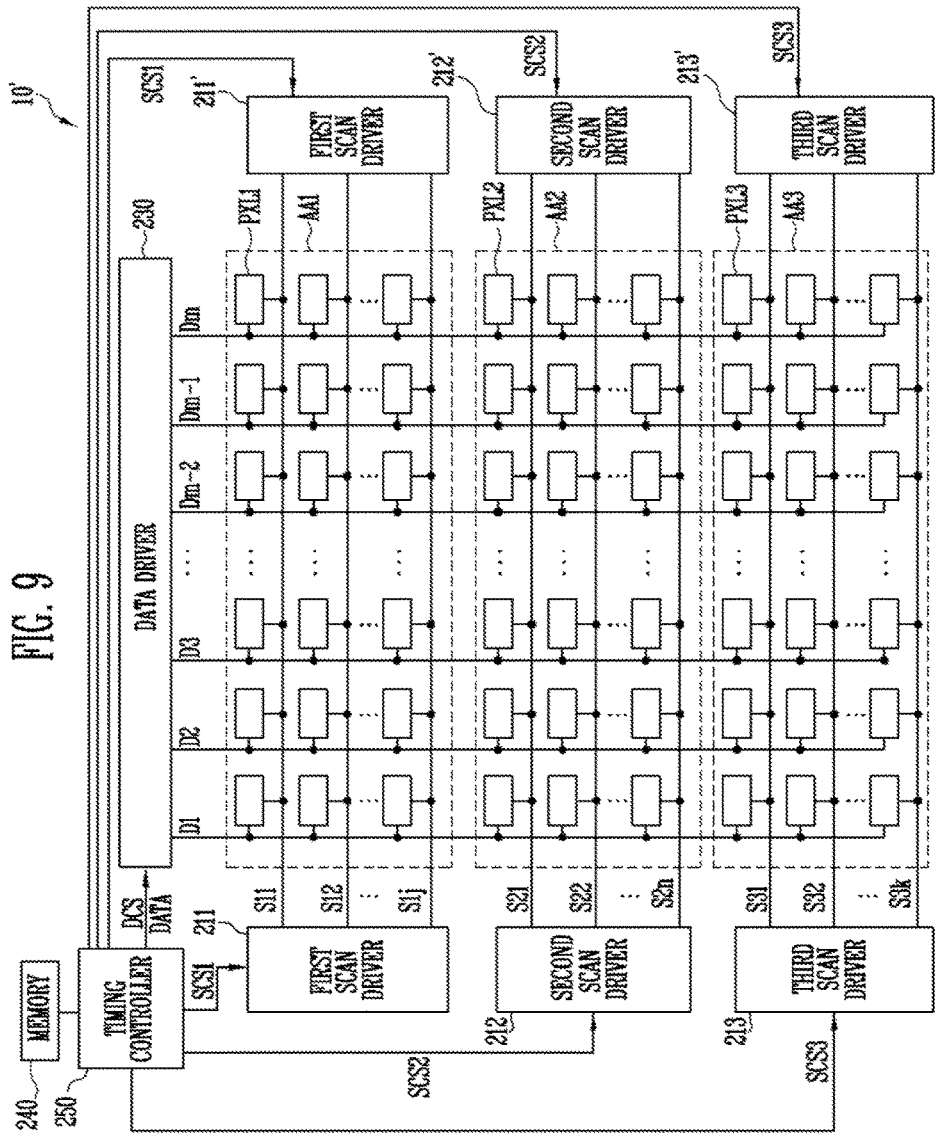
FIG. 9 is a diagram illustrating a configuration of a display device according to another exemplary embodiment of the present disclosure in more detail.

FIG. 9 is a diagram illustrating a configuration of a display device according to another exemplary embodiment of the present disclosure in more detail. Hereinafter, differences in comparison of the aforementioned exemplary embodiments will be mainly described, and the same or substantially the same description between the aforementioned exemplary embodiments may not be repeated.

Referring to FIG. 9, a display device 10', according to another exemplary embodiment of the present disclosure, may include a plurality of first scan drivers 211 and 211', a plurality of second scan drivers 212 and 212', and a plurality of third scan drivers 213 and 213', in order to prevent or reduce a delay of a scan signal.

The first scan drivers 211 and 211' may be connected to respective ends of the first scan lines S11 to S1$j$.

The first scan drivers 211 and 211' may supply first scan signals to the first scan lines S11 to S1$j$ in response to the same or substantially the same scan driver control signal SCS1.

Accordingly, the first scan drivers 211 and 211' may supply the first scan signals to the same scan line concurrently (e.g., at the same time).

Further, the first scan drivers 211 and 211' may have the same or substantially the same circuit structure.

The second scan drivers 212 and 211' may be connected to respective ends of the second scan lines S21 to S2$n$.

The second scan drivers 212 and 212' may supply second scan signals to the second scan lines S21 to S2$n$ in response to the same or substantially the same scan driver control signal SCS2.

Accordingly, the second scan drivers 212 and 212' may supply the second scan signals to the same scan line concurrently (e.g., at the same time).

Further, the second scan drivers 212 and 212' may have the same or substantially the same circuit structure.

The third scan drivers 213 and 213' may be connected to respective ends of the third scan lines S31 to S3$k$.

The third scan drivers 213 and 213' may supply third scan signals to the third scan signals S31 to S3$k$ in response to the same or substantially the same scan driver control signal SCS3.

Accordingly, the third scan drivers 213 and 213' may supply the third scan signals to the same scan line concurrently (e.g., at the same time).

Further, the third scan drivers 213 and 213' may have the same or substantially the same circuit structure.

Figure 10:
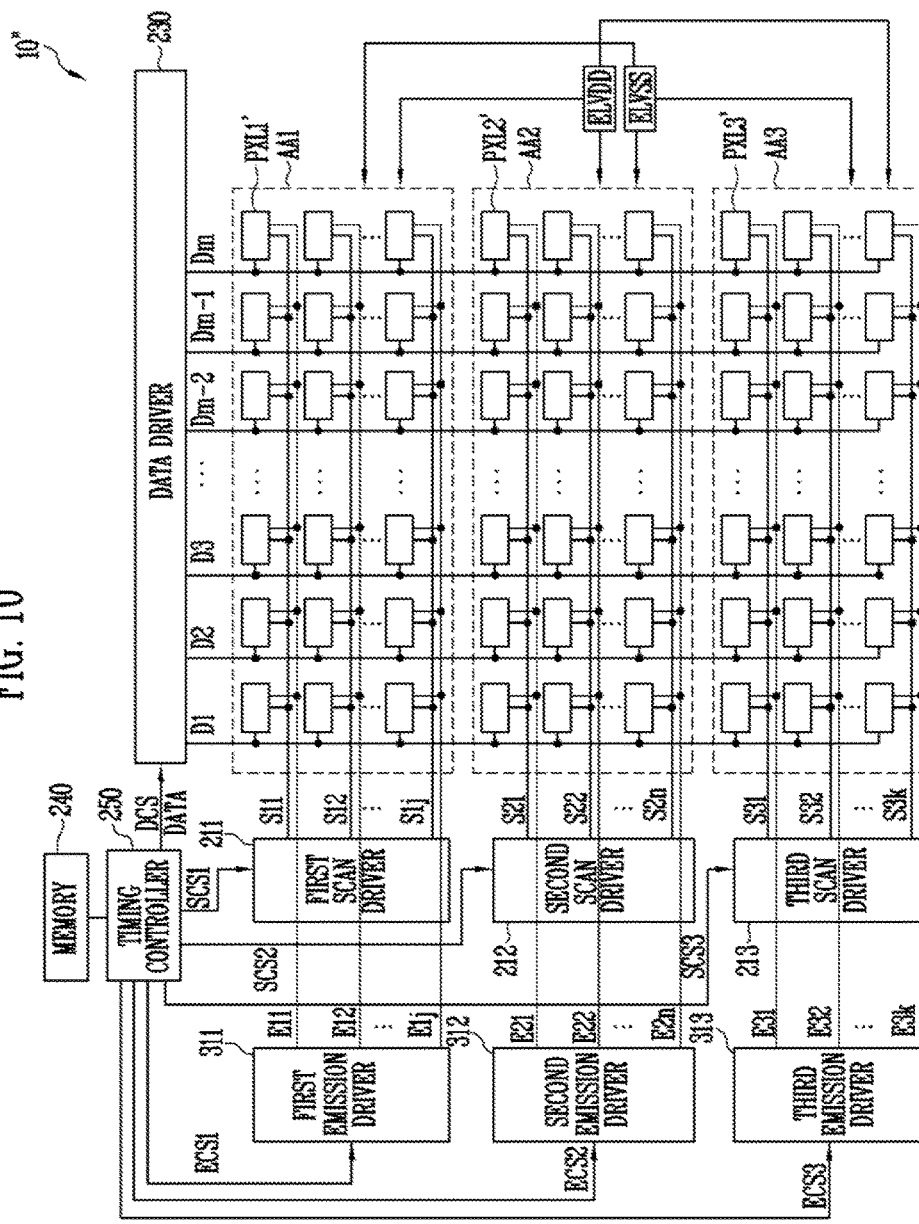
FIG. 10 is a diagram illustrating a configuration of a display device according to another exemplary embodiment of the present disclosure in more detail.

FIG. 10 is a diagram illustrating a configuration of a display device according to another exemplary embodiment of the present disclosure in more detail. Hereinafter, differences in comparison of the aforementioned exemplary embodiments will be mainly described, and the same or substantially the same description between the aforementioned exemplary embodiments may not be repeated.

Referring to FIG. 10, a display device 10'', according to an exemplary embodiment of the present disclosure, may include first, second, and third pixels PXL1', PXL2', and PXL3', and a display driver.

The display driver may include a first scan driver 211, a second scan driver 212, a third scan driver 213, a first emission driver 311, a second emission driver 312, a third emission driver 313, a data driver 230, memory 240, and a timing controller 250.

The first pixels PXL1' may be located (e.g., positioned) in a first pixel area AA1 that is divided by first scan lines S11 to S1$j$, first emission control lines E11 to E1$j$, and data lines D1 to Dm.

The second pixels PXL2' may be located in a second pixel area AA2 that is divided by second scan lines S21 to S2$n$, second emission control lines E21 to E2$n$, and the data lines D1 to Dm.

The third pixels PXL3' may be located in a third pixel area AA3 that is divided by third scan lines S31 to S3$k$, third emission control lines E31 to E3$k$, and the data lines D1 to Dm.

The first emission driver 311 may supply first emission control signals to the first emission control lines E11 to E1$j$ in response to a first emission driver control signal ECS1 from a timing controller 250.

For example, the first emission driver 311 may sequentially supply the first emission control signals to the first emission control lines E11 to E1$j$.

The second emission driver 312 may supply second emission control signals to the second emission control lines E21 to E2$n$ in response to a second emission driver control signal ECS2 from the timing controller 250.

For example, the second emission driver 312 may sequentially supply the second emission control signals to the second emission control lines E21 to E2$n$.

The third emission driver 313 may supply third emission control signals to the third emission control E31 to E3$k$ in response to a third emission driver control signal ECS3 from the timing controller 250.

For example, the third emission driver 313 may sequentially supply the third emission control signals to the third emission control lines E31 to E3$k$.

The emission control signal may have a gate off voltage (for example, a voltage with a high level), so that corresponding transistors included in the pixels PXL1', PXL2', and PXL3' may be turned off, and the scan signal may have a gate on voltage (for example, a voltage with a low level), so that corresponding transistors included in the pixels PXL1', PXL2', and PXL3' may be turned on.

Figure 11A:
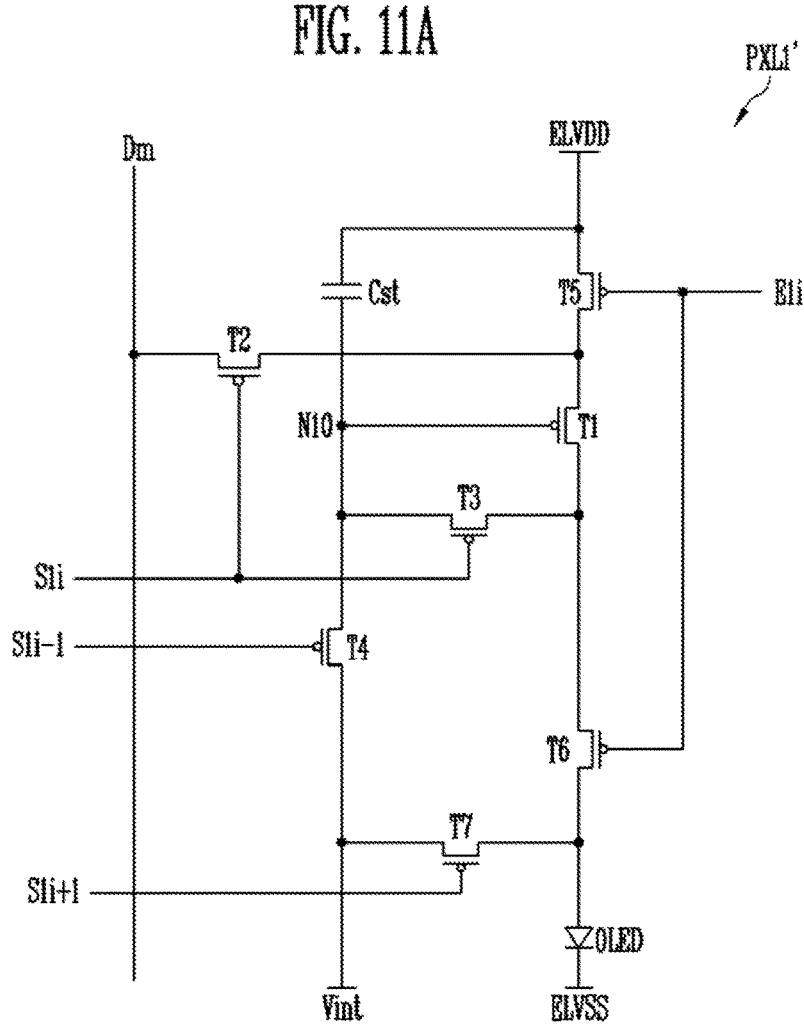
FIGS. 11A and 11B are diagrams illustrating an exemplary embodiment of one of the first pixels illustrated in FIG. 10, and a driving method thereof.
Figure 11B:
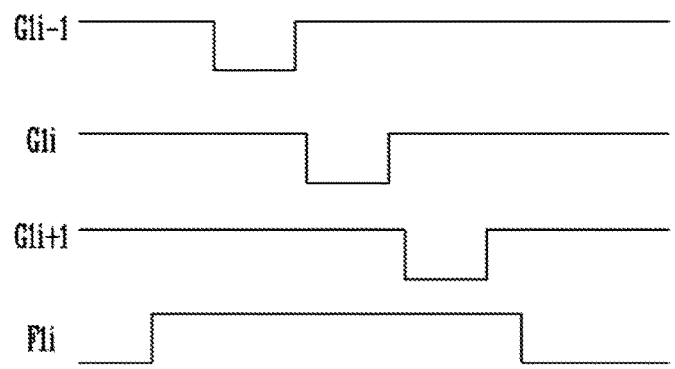

FIGS. 11A and 11B are diagrams illustrating an exemplary embodiment of one of the first pixels illustrated in FIG. 10, and a driving method thereof.

For convenience of description, FIG. 11A illustrates the first pixel PXL1' from among the first pixels PXL1' connected to the $m^{th}$ data line Dm and the $i^{th}$ first scan line S1$i$.

Referring to FIG. 11A, the first pixel PXL1', according to an exemplary embodiment of the present disclosure, may include an organic light emitting diode OLED, first through seventh transistors T1 through T7, and a storage capacitor Cst.

An anode of the organic light emitting diode OLED may be connected to the first transistor T1 via the sixth transistor T6, and a cathode of the organic light emitting diode OLED may be connected to a second pixel power source ELVSS. The organic light emitting diode OLED may generate light with a brightness (e.g., a predetermined brightness) in response to the quantity of current supplied from the first transistor T1.

A first pixel power source ELVDD may have a higher voltage than that of the second pixel power source ELVSS, so that a current may flow to the organic light emitting diode OLED.

The seventh transistor T7 may be connected between an initialization power source Vint and the anode of the organic light emitting diode OLED. Further, a gate electrode of the seventh transistor T7 may be connected to an $i+1^{th}$ first scan line S1$i$+1. The seventh transistor T7 may be turned on when a scan signal is supplied to the $i+1^{th}$ first scan line S1$i$+1, to supply the voltage of the initialization power source Vint to the anode of the organic light emitting diode OLED. Here, the initialization power source Vint may have a lower voltage than that of the data signal.

The sixth transistor T6 may be connected between the first transistor T1 and the organic light emitting diode OLED. Further, a gate electrode of the sixth transistor T6 may be connected to an $i^{th}$ first emission control line E1$i$. The sixth transistor T6 may be turned off when an emission control signal is supplied to the i$^{th}$ first emission control line E1i, and may be turned on in other cases.

The fifth transistor T5 may be connected between the first pixel power source ELVDD and the first transistor T1. Further, a gate electrode of the fifth transistor T5 may be connected to the i$^{th}$ first emission control line E1i. The fifth transistor T5 may be turned off when an emission control signal is supplied to the i$^{th}$ first emission control line E1i, and may be turned on in other cases.

A first electrode of the first transistor T1 (e.g., a driving transistor) may be connected to the first pixel power source ELVDD via the fifth transistor T5, and a second electrode of the first transistor T1 may be connected to the anode of the organic light emitting diode OLED via the sixth transistor T6. Further, a gate electrode of the first transistor T1 may be connected to a tenth node N10. The first transistor T1 may control the quantity of current flowing from the first pixel power source ELVDD to the second pixel power source ELVSS via the organic light emitting diode OLED in response to a voltage of the tenth node N10.

The third transistor T3 may be connected between the second electrode of the first transistor T1 and the tenth node N10. Further, a gate electrode of the third transistor T3 may be connected to the i$^{th}$ first scan line S1i. The third transistor T3 may be turned on when a scan signal is supplied to the i$^{th}$ first scan line S1i, to electrically connect the second electrode of the first transistor T1 and the tenth node N10. Accordingly, when the third transistor T3 is turned on, the first transistor T1 may be connected in a form of a diode.

The fourth transistor T4 may be connected between the tenth node N10 and the initialization power source Vint. Further, a gate electrode of the fourth transistor T4 may be connected to an i-1$^{th}$ first scan line S1i-1. The fourth transistor T4 may be turned on when a scan signal is supplied to the i-1$^{th}$ first scan line S1i-1, to supply the voltage of the initialization power source Vint to the tenth node N10.

The second transistor T2 may be connected between the m$^{th}$ data line Dm and the first electrode of the first transistor T1. Further, a gate electrode of the second transistor T2 may be connected to the i$^{th}$ first scan line S1i. The second transistor T2 may be turned on when a scan signal is supplied to the i$^{th}$ first scan line S1i, to electrically connect the m$^{th}$ data line Dm to the first electrode of the first transistor T1.

The storage capacitor Cst is connected between the first pixel power source ELVDD and the tenth node N10. The storage capacitor Cst may store the data signal and a voltage corresponding to a threshold voltage of the first transistor T1.

Each of the other first pixels PXL1', the second pixels PXL2', and the third pixels PXL3' may be implemented with the same or substantially the same circuit structure as that of the first pixel PXL1' described with reference to FIG. 11A. Accordingly, detailed descriptions of the other first pixels PXL1", the second pixels PXL2', and the third pixels PXL3' may be omitted.

Further, the pixel structure described with reference to FIG. 11A is only one example of a pixel structure using the scan line and the emission control line, and the pixels PXL1', PXL2', and PXL3' of the present disclosure are not limited to the aforementioned pixel structure. For example, as long as the pixel has a circuit structure capable of supplying a current to the organic light emitting diode OLED, any suitable pixel structure may be used.

In the present disclosure, the organic light emitting diode OLED may generate various colors of light, including red light, green light, and/or blue light, for example, in response to the quantity of current supplied from the driving transistor, but the organic light emitting diode OLED is not limited thereto. For example, the organic light emitting diode OLED may generate white light in response to the quantity of current supplied from the driving transistor. In this case, a separate color filter, and/or the like may be used to implement a color image.

Referring to FIG. 11B, an emission control signal F1i is first supplied to the i$^{th}$ first emission control line E1i. When the emission control signal F1i is supplied to the i$^{th}$ first emission control line E1i, the fifth transistor and the sixth transistor are turned off. In this case, the first pixel PXL1' may be set to a non-emission state.

Then, a scan signal G1i-1 is supplied to the i-1$^{th}$ first scan line S1i-1, so that the fourth transistor T4 is turned on. When the fourth transistor T4 is turned on, the voltage of the initialization power source Vint is supplied to the tenth node N10. Then, the tenth node N10 may be initialized to the voltage of the initialization power source Vint.

The tenth node 10 is initialized to the voltage of the initialization power source Vint, and then the scan signal G1i is supplied to the i$^{th}$ first scan line S1i. When the scan signal G1i is supplied to the i$^{th}$ first scan line S1i, the second transistor T2 and the third transistor T3 are turned on.

When the third transistor T3 is turned on, the first transistor T1 is connected in a form of a diode.

When the second transistor M2 is turned on, the data signal from the m$^{th}$ data line Dm is supplied to the first electrode of the first transistor T1. In this case, since the tenth node N10 is initialized to the voltage of the initialization power source Vint, which is lower than the data signal, the first transistor T1 may be turned on. When the first transistor T1 is turned on, a voltage obtained by subtracting the threshold voltage of the first transistor T1 from the data signal is applied to the tenth node N10. The storage capacitor Cst stores the data signal applied to the tenth node N10 and the voltage corresponding to the threshold voltage of the first transistor T1.

Then, a scan signal G1i+1 is supplied to the i+1$^{th}$ first scan line S1i+1. When the scan signal G1i+1 is supplied to the i+1$^{th}$ first scan line S1i+1, the seventh transistor T7 is turned on.

When the seventh transistor T7 is turned on, the voltage of the initialization power source Vint is supplied to the organic light emitting diode OLED. Then, a parasitic capacitor, which may be parasitically formed in the organic light emitting diode OLED, is discharged, thereby improving a black expression capability.

Then, the supply of the emission control signal F1i to the i$^{th}$ first emission control line E1i is stopped.

When the supply of the emission control signal F1i to the i$^{th}$ first emission control line E1i is stopped, the fifth transistor T5 and the sixth transistor T6 are turned on. Then, a current path connected from the first power source ELVDD to the second power source ELVSS via the fifth transistor T5, the first transistor T1, the sixth transistor T6, and the organic light emitting diode OLED, is formed.

In this case, the first transistor T1 controls the quantity of current flowing from the first power source ELVDD to the second power source ELVSS via the organic light emitting diode OLED in response to the voltage applied to the tenth node N10. The organic light emitting diode OLED generates light with a luminance (e.g., a predetermined luminance) in response to the quantity of current supplied from the first transistor T1.

The first pixel PXL1' may generate light with the luminance (e.g., the predetermined luminance), while repeating the aforementioned process. Further, the other first pixels PXL1', the second pixels PXL2', and the third pixels PXL3' may be driven by the same or substantially the same method as that of the first pixel PXL1' described with reference to FIG. 11B.

The emission control signal F1$i$ supplied to the $i^{th}$ first emission control line E1$i$ may be supplied to overlap with at least one scan signal, so that the pixels PXL1', PXL2', and PXL3' are set in the non-emission state for a period (or duration), during which the data signal is charged in the pixels PXL1', PXL2', and PXL3'. A supply timing of the emission control signal F1$i$ may be variously changed.

Figure 12:
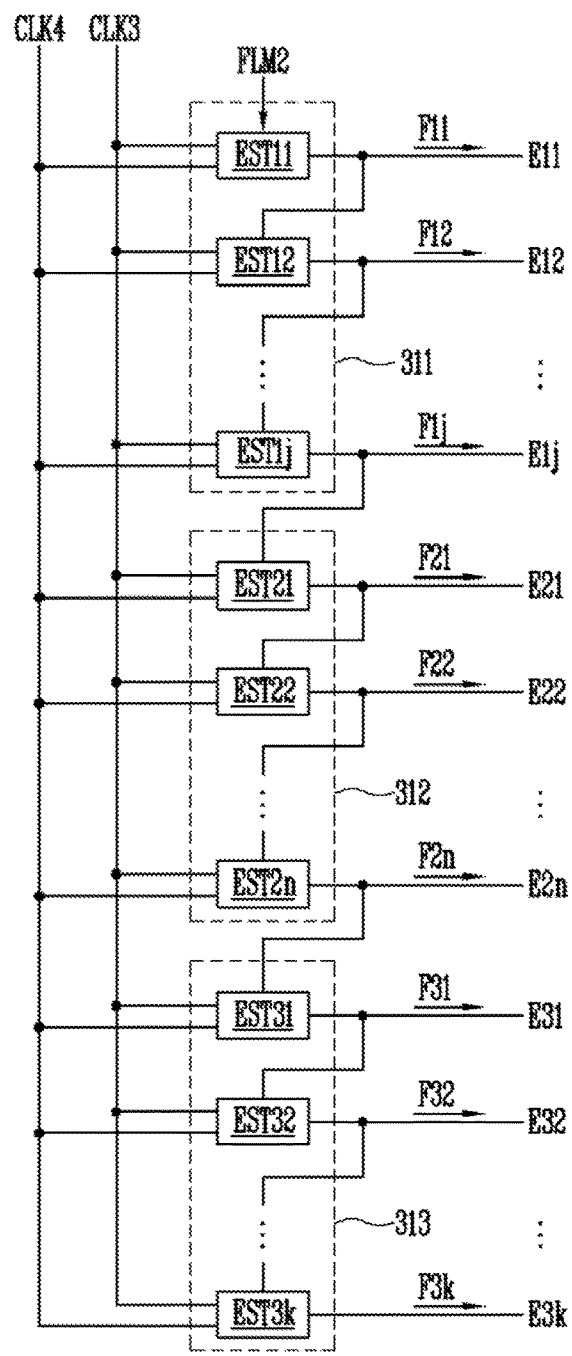
FIG. 12 is a diagram illustrating emission drivers illustrated in FIG. 10 in more detail.

FIG. 12 is a diagram illustrating the emission drivers illustrated in FIG. 10 in more detail.

Referring to FIG. 12, the first emission driver 311 may include a plurality of first emission stage circuits EST11 to EST1$j$.

The first emission stage circuits EST11 to EST1$j$ may be connected to one ends of the first emission control lines E11 to E1$j$, respectively. The first emission stage circuits EST11 to EST1$j$ may supply the first emission control signals F11 to F1$j$ to the first emission control lines E11 to E1$j$, respectively.

In this case, the first emission stage circuits EST11 to EST1$j$ may be operated in response to clock signals CLK3 and CLK4 supplied from the timing controller 250. Further, each of the first emission stage circuits EST11 to EST1$j$ may be implemented with the same or substantially the same circuit structure.

The first emission stage circuits EST11 to EST1$j$ may receive an output signal (that is, an emission control signal) of a previous emission stage circuit or a second start signal FLM2.

For example, a first first emission stage circuit EST11 may receive the second start signal FLM2, and the other first emission stage circuits EST12 to EST1$j$ may receive output signals of a corresponding previous emission stage circuit.

The second emission stage circuits EST21 to EST2$n$ may be connected to one ends of the second emission control lines E21 to E2$n$, respectively. The second emission stage circuits EST21 to EST2$n$ may supply the second emission control signals F21 to F2$n$ to the second emission control lines E21 to E2$n$, respectively.

In this case, the second emission stage circuits EST21 to EST2$n$ may be operated in response to the clock signals CLK3 and CLK4 supplied from the timing controller 250. Further, each of the second emission stage circuits EST21 to EST2$n$ may be implemented with the same or substantially the same circuit structure.

Each of the second emission stage circuits EST21 to EST2$n$ may receive an output signal of a corresponding previous emission stage circuit.

For example, a first second emission stage circuit EST21 may use a signal F1$j$ output from a last first emission stage circuit EST1$j$ of the first emission driver 311 as a start signal, and the other second emission stage circuits EST22 to EST2$n$ may receive an output signal of a corresponding previous emission stage circuit.

Further, a last second emission stage circuit EST2$n$ of the second emission driver 312 may supply the output signal to a first third emission stage circuit EST31 of the third emission driver 313.

The third emission stage circuits EST31 to EST3$k$ may be connected to one ends of the third emission control lines E31 to E3$k$, respectively. The third emission stage circuits EST31 to EST3$k$ may supply the third emission control signals F31 to F3$k$ to the third emission control lines E31 to E3$k$, respectively.

In this case, the third emission stage circuits EST31 to EST3$k$ may be operated in response to the clock signals CLK3 and CLK4 supplied from the timing controller 250. Further, each of the third emission stage circuits EST31 to EST3$k$ may be implemented with the same or substantially the same circuit structure.

Each of the third emission stage circuits EST31 to EST3$k$ may receive an output signal of a corresponding previous emission stage circuit.

For example, the first third emission stage circuit SST31 may use a signal F2$n$ output from the last second emission stage circuit EST2$n$ of the second emission driver 312 as a start signal, and the other third emission stage circuits EST32 to EST3$k$ may receive output signals of a corresponding previous emission stage circuit.

In addition, the widths of the emission control signals F11 to F1$j$, F21 to F2$n$, and F31 to F3$k$ may be determined in response to the width of the second start signal FLM2. That is, when the width of the second start signal FLM2 is increased, the widths of the emission control signals F11 to F1$j$, F21 to F2$n$, and F31 to F3$k$ may be increased.

The width of the second start signal FLM2 may be variously set in response to a driving method.

Figure 13A:
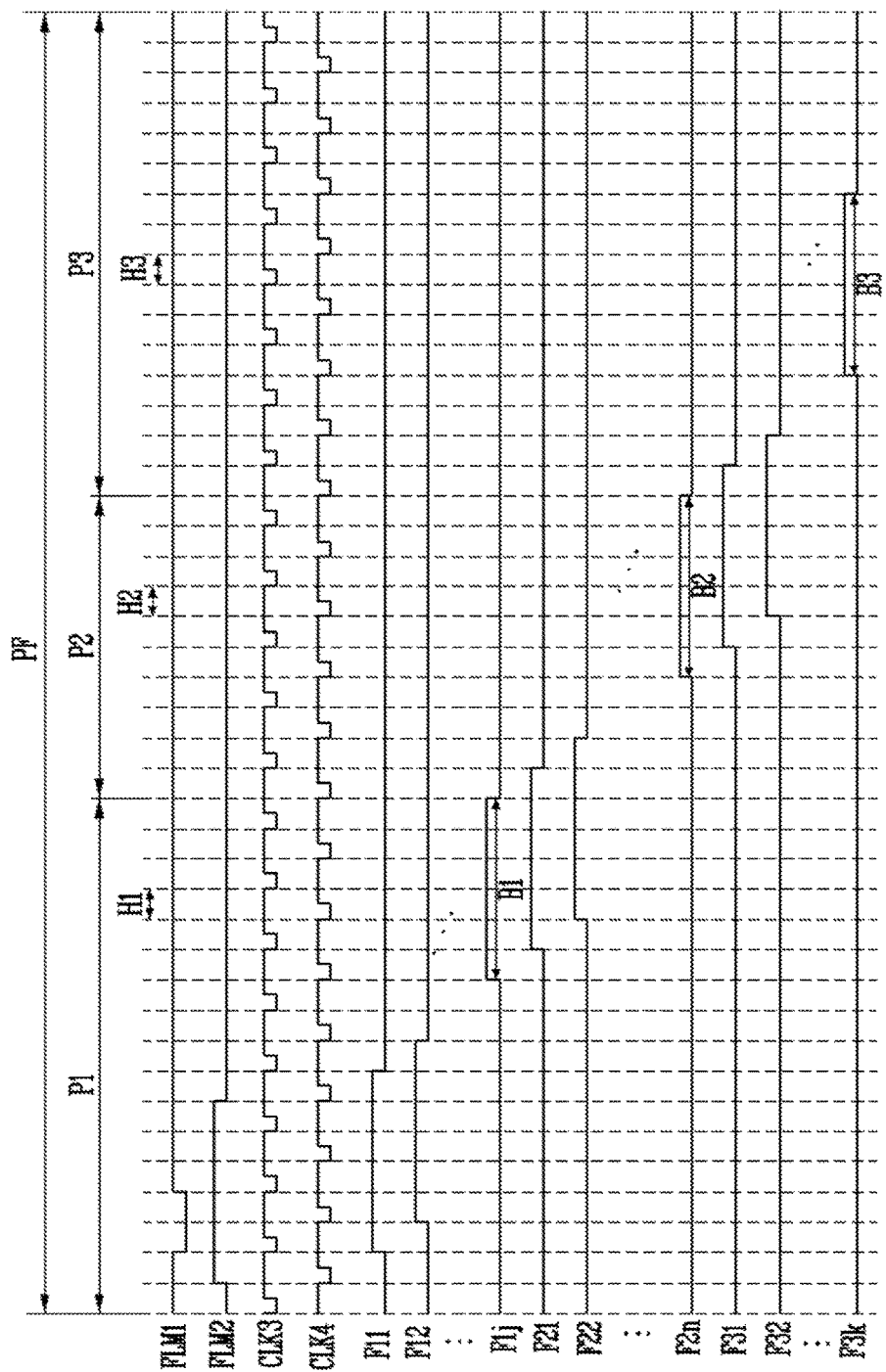
FIGS. 13A and 13B are waveform diagrams for describing a driving method of a display device according to an exemplary embodiment of the present disclosure.
Figure 13B:
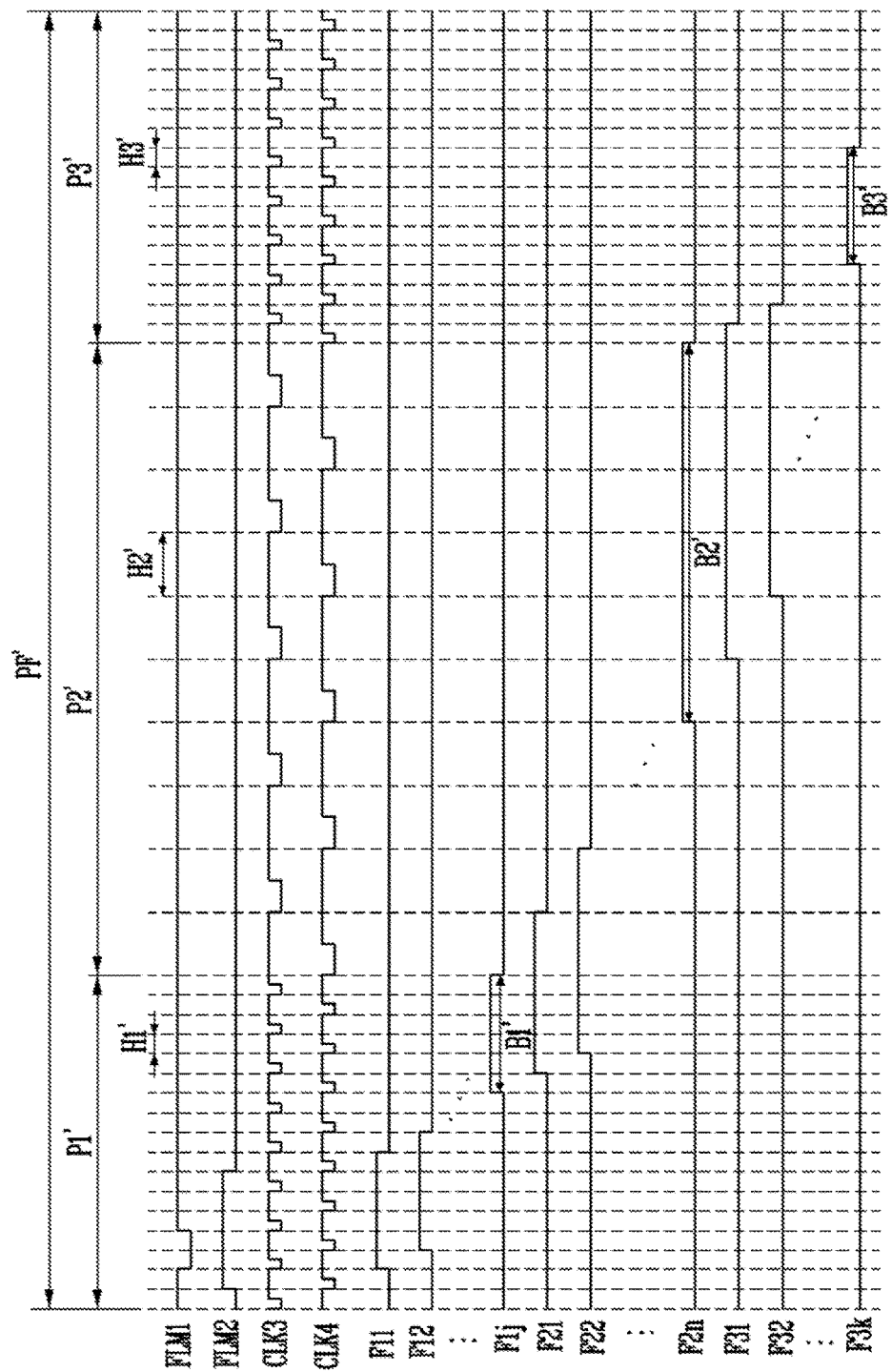

FIGS. 13A and 13B are waveform diagrams for describing a driving method of a display device according to an exemplary embodiment of the present disclosure. In more detail, FIG. 13A illustrates one frame period PF when the display device is driven in the second mode, and FIG. 13B illustrates one frame period PF' when the display device is driven in the first mode. In this case, the scan signals G11 to G1$j$, G21 to G2$n$, and G31 to G3$k$ may be supplied in the form illustrated in FIGS. 6A and 6B, so that a detailed description and an illustration thereof will not be repeated. For reference, the first start signal FLM1 is additionally illustrated.

Referring to FIG. 13A, when the display device is driven in the second mode, the first emission control signals F11 to F1$j$ may be supplied during the first period P1, the second emission control signals F21 to F2$n$ may be supplied during the second period P2, and the third emission control signals F31 to F3$k$ may be supplied during the third period P3.

The first emission driver 311 starts the supply of the first emission control signals F11 to F1$j$ in response to the supply of the second start signal FLM2, and the second emission driver 312 and the third emission driver 313 may sequentially start the supply of the second emission control signals F21 to F2$n$ and the third emission control signals F31 to F3$k$, respectively.

For example, the first emission driver 311 may sequentially supply the first emission control signals F11 to F1$j$ during the first period P1, the second emission driver 312 may sequentially supply the second emission control signals F21 to F2$n$ during the second period P2, and the third emission driver 313 may sequentially supply the third emission control signals F31 to F3$k$ during the third period P3.

In this case, each of the first emission control signals F11 to F1$j$ may have a first pulse width B1, each of the second emission control signals F21 to F2$n$ may have a second pulse width B2, and each of the third emission control signals F31 to F3$k$ may have a third pulse width B3.

Further, the first period P1 may include a plurality of first horizontal periods H1, the second period P2 may include a plurality of second horizontal periods H2, and the third period P3 may include a plurality of third horizontal periods H3.

The second mode corresponds to a normal mode, so that the first pulse width B1, the second pulse width B2, and the third pulse width B3 may be the same or substantially the same with each other, and the lengths (or widths) of the first horizontal period H1, the second horizontal period H2, and the third horizontal period H3 may be the same or substantially the same with each other.

For example, each of the emission control signals F11 to F1j, F21 to F2n, and F31 to F3k may correspond (or be set) to an integral time of each of the horizontal periods H1, H2, and H3. Accordingly, FIGS. 13A and 13B illustrate a case where each of the emission control signals F11 to F1j, F21 to F2n, and F31 to F3k have the same or substantially the same width as those of six horizontal periods as an example.

In order to set the first pulse width B1, the second pulse width B2, and the third pulse width B3 to be the same or substantially the same with each other, the widths of the clock signals CLK3 and CLK4 that are supplied for each of the periods P1, P2, and P3 may be set to be the same or substantially the same with each other.

Referring to FIG. 13B, a first pulse width B1' of the first emission control signals F11 to F1j may be different from a second pulse width B2' of the second emission control signals F21 to F2n when the display device is driven in the first mode.

Further, a third pulse width B3' of the third emission control signals F31 to F3k may be different from the second pulse width B2' of the second emission control signals F21 to F2n when the display device is driven in the first mode.

For example, the first pulse width B1' may be smaller than the second pulse width B2', and the third pulse width B3' may be smaller than the second pulse width B2'.

As described above, in order to set the first pulse width B1', the second pulse width B2', and the third pulse width B3', the widths of the clock signals CLK3 and CLK4 supplied for each of the periods P1', P2', and P3' may be changed.

Further, according to the decrease of the lengths of the first period P1' and the third period P3', the lengths (or widths) of the first horizontal periods H1' and the third horizontal periods H3' may also be decreased, and according to the increase of the length of the second period P2', the length (or width) of the second horizontal periods H2' may be increased.

Accordingly, the lengths (or widths) of the first horizontal periods H1' and the third horizontal periods H3' may be smaller than the length (or width) of the second horizontal periods H2'.

The lengths (or widths) of the first horizontal periods H1 and H1', the second horizontal periods H2 and H2', and the third horizontal periods H3 and H3' may be controlled by the timing controller 250.

Further, the first pulse width B1' and the third pulse width B3' may be the same or substantially the same as each other, or may be different from each other, and the length (or width) of the first horizontal periods H1' and the length (or width) of the third horizontal periods H3' may be the same or substantially the same as each other, or may be different from each other.

Figure 14A:
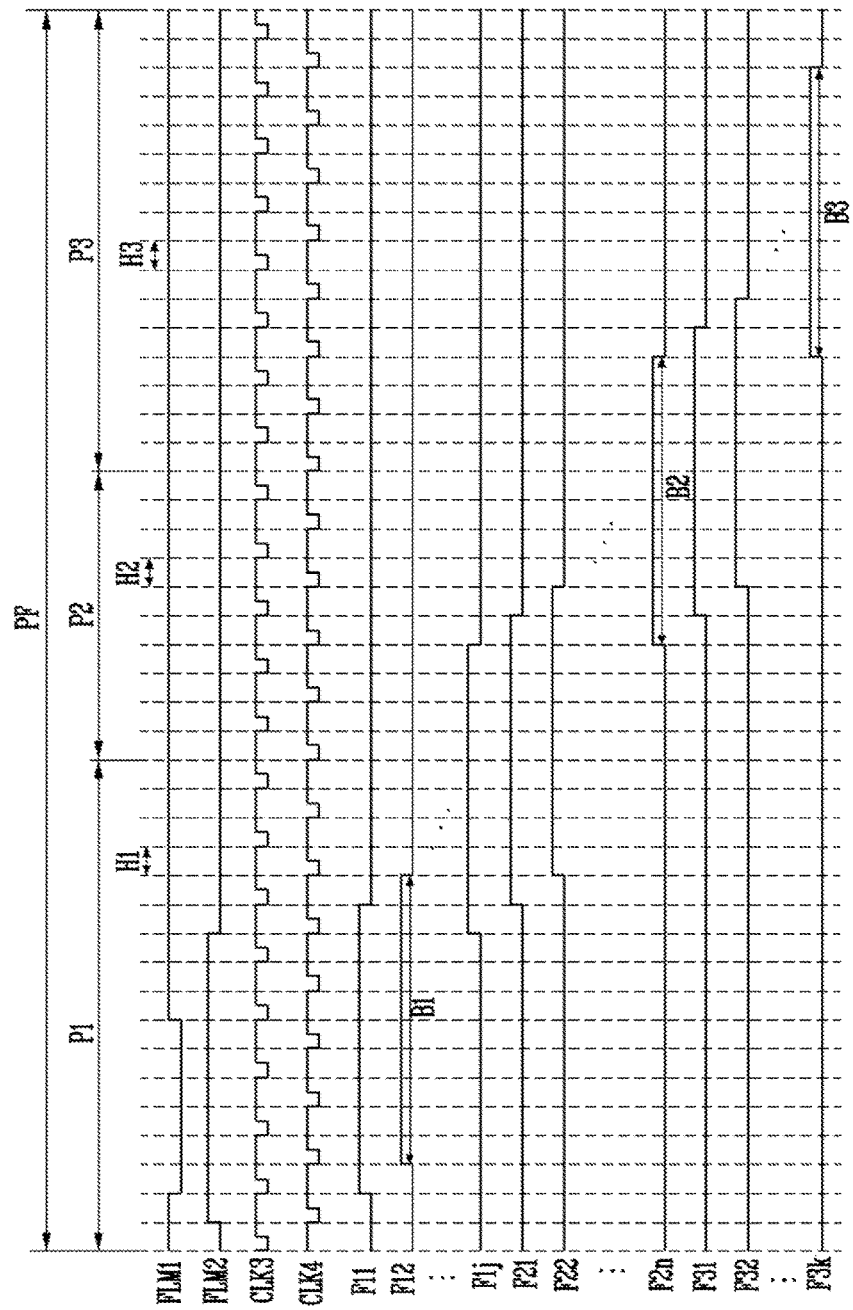
FIGS. 14A and 14B are waveform diagrams for describing a driving method of a display device according to another exemplary embodiment of the present disclosure.
Figure 14B:
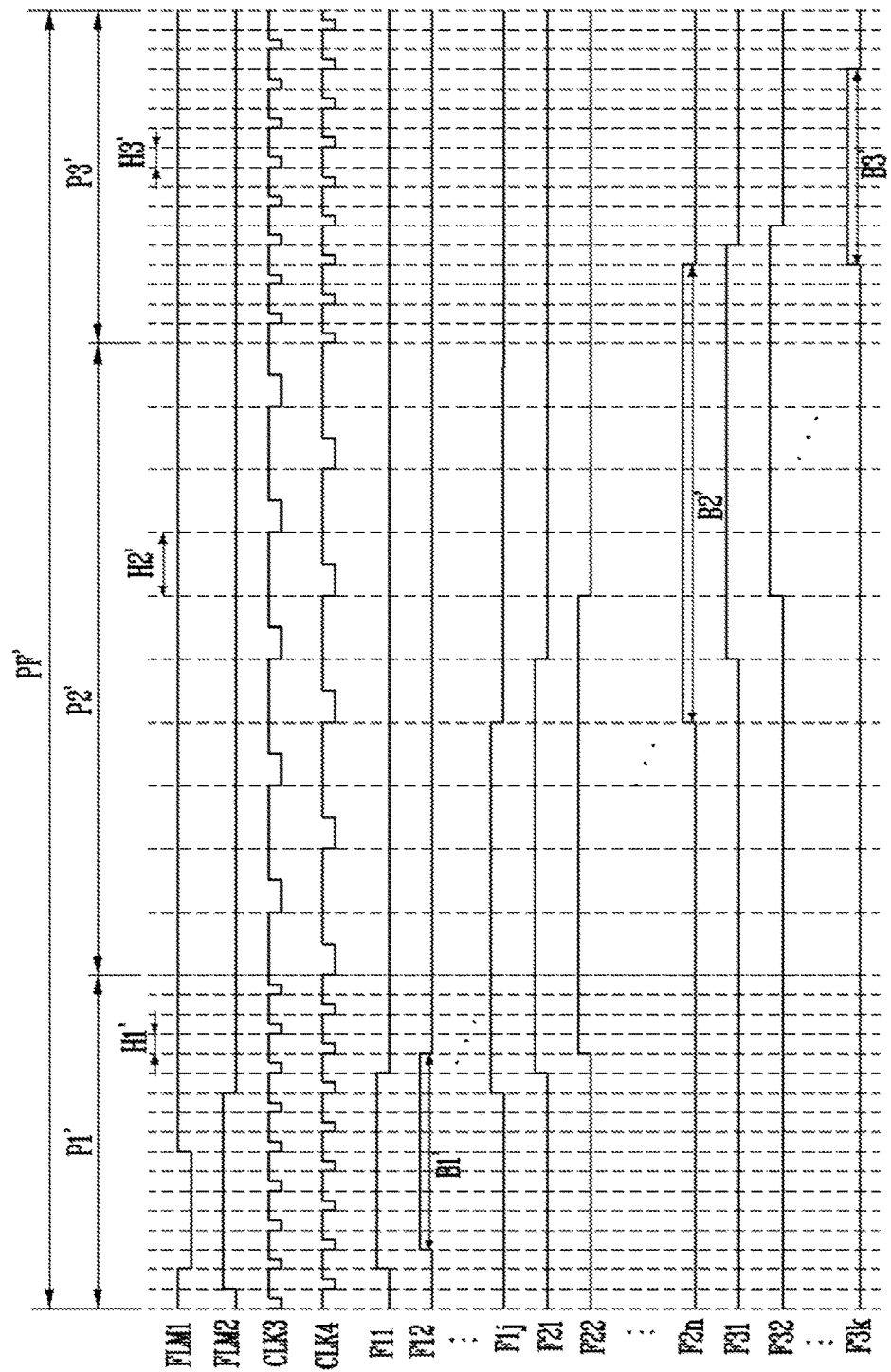

FIGS. 14A and 14B are waveform diagrams for describing a driving method of a display device according to another exemplary embodiment of the present disclosure. In more detail, FIG. 14A illustrates one frame period PF when the display device is driven in the second mode, and FIG. 14B illustrates one frame period PF' when the display device is driven in the first mode. In this case, the scan signals G11 to G1j, G21 to G2n, and G31 to G3k may be supplied in the form illustrated in FIGS. 7A and 7B, so that a detailed description and an illustration thereof will not be repeated. For reference, the first start signal FLM1 is additionally illustrated.

FIGS. 13A and 13B illustrate the case where each of the emission control signals F11 to F1j, F21 to F2n, and F31 to F3k have the same or substantially the same width as those of the six horizontal periods, but FIGS. 14A and 14B illustrate a case where each of the emission control signals F11 to F1j, F21 to F2n, and F31 to F3k have the same or substantially the same width as those of ten horizontal periods, for example.

Hereinafter, differences in comparison with the aforementioned exemplary embodiments will be mainly described, and the same or substantially the same description between the aforementioned exemplary embodiments may not be repeated.

Referring to FIG. 14A, when the display device is driven in the second mode, a first pulse width B1 of the first emission control signals F11 to F1j, a second pulse width B2 of the second emission control signals F21 to F2n, and a third pulse width B3 of the third emission control signals F31 to F3k may be the same or substantially the same with each other.

Further, the first horizontal periods H1 of the first period P1, the second horizontal periods H2 of the second period P2, and the third horizontal periods H3 of the third period P3 may have the same or substantially the same lengths (or widths) with each other.

Referring to FIG. 14B, a first pulse width B1' of the first emission control signals F11 to F1j may be different from a second pulse width B2' of the second emission control signals F21 to F2n when the display device is driven in the first mode.

Further, a third pulse width B3' of the third emission control signals F31 to F3k may be different from a second pulse width B2' of the second emission control signals F21 to F2n when the display device is driven in the first mode.

For example, the first pulse width B1' may be smaller than the second pulse width B2', and the third pulse width B3' may be smaller than the second pulse width B2'.

However, some of the first emission control signals F11 to F1j may have the pulse width B1' that is larger than those of the other first emission control signals.

For example, the jth first emission control signal F1j may be supplied for six first horizontal periods H1' during the first period P1', and may be supplied for four second horizontal periods H2' during the second period P2'.

In this case, the length (or width) of the second horizontal period H2' is larger than the length (or width) of the first horizontal period H1', so that the $j^{th}$ first emission control signal F1j may have the pulse width B1' that is larger than those of other first emission control signals that are supplied for the ten first horizontal periods H1'.

Further, some of the second emission control signals F21 to F2n may have the pulse width B2' that is larger than those of other second emission control signals.

For example, the first second emission control signal F21 may be supplied for five first horizontal periods H1' during the first period P1', and may be supplied for five second horizontal periods H2' during the second period P2'.

Further, an $n^{th}$ second emission control signal F2n may be supplied for six second horizontal periods H2' during the second period P2', and may be supplied for four third horizontal periods H3' during the third period P3'.

In this case, the length (or width) of the second horizontal period H2' is larger than the lengths (or widths) of the first horizontal period H1' and the third horizontal period H3', so that the first second emission control signal F21 and the $n^{th}$ second emission control signal F2$n$ may have smaller pulse widths than those of other second emission control signals that are supplied for ten second horizontal periods H2'.

Further, some of the third emission control signals F31 to F3$k$ may have the pulse width B3' that are larger than those of other third emission control signals.

For example, the first third emission control signal F31 may be supplied for five second horizontal periods H2' during the second period P2', and may be supplied for five third horizontal periods H3' during the third period P3'.

In this case, the length (or width) of the second horizontal period H2' is larger than the length (or width) of the third horizontal period H3', so that the first third emission control signal F31 may have a pulse width that is larger than those of other third emission control signals that are supplied for ten third horizontal periods H3'.

FIGS. 14A and 14B illustrate the case where each of the emission control signals F11 to F1$j$, F21 to F2$n$, and F31 to F3$k$ are supplied for the ten horizontal periods as an example, but the present disclosure is not limited thereto, and the supply periods of the emission control signals F11 to F1$j$, F21 to F2$n$, and F31 to F3$k$ may be variously changed.

Figure 15:
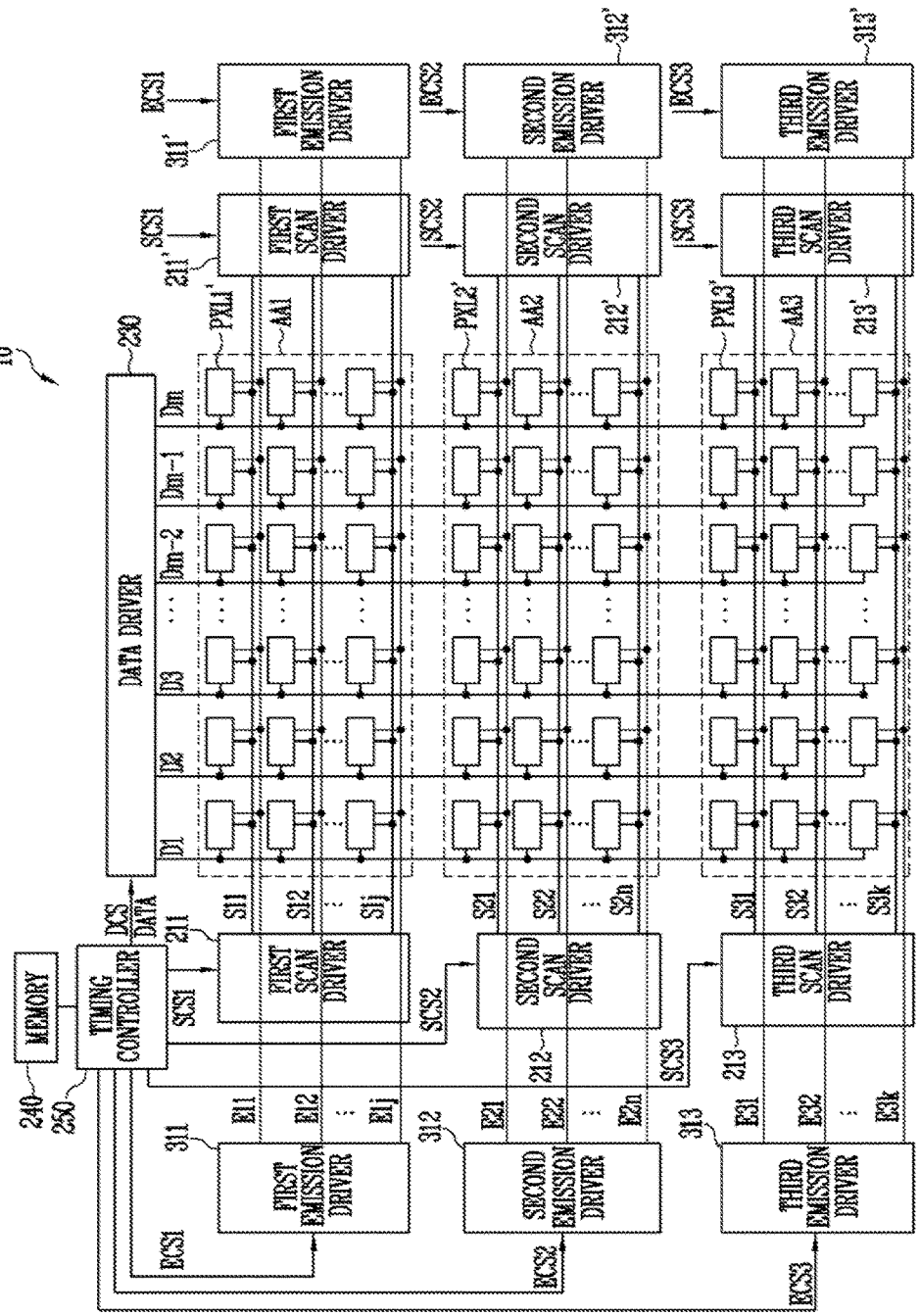
FIG. 15 is a diagram illustrating a configuration of a display device according to another exemplary embodiment of the present disclosure in more detail.

FIG. 15 is a diagram illustrating a configuration of a display device according to another exemplary embodiment of the present disclosure in more detail. Hereinafter, differences in comparison with the aforementioned exemplary embodiments will be mainly described, and the same or substantially the same description between the aforementioned exemplary embodiments may not be repeated.

Referring to FIG. 15, a display device 10$m$, according to another exemplary embodiment of the present disclosure, may include a plurality of first emission drivers 311 and 311', a plurality of second emission drivers 312 and 312', and a plurality of third emission drivers 313 and 313', to prevent or reduce a delay of an emission control signal.

The first emission drivers 311 and 311' may be connected to respective ends of the first emission control lines E11 to E1$j$.

The first emission drivers 311 and 311' may supply first emission control signals to the first emission control lines E11 to E1$j$ in response to the same or substantially the same first emission driver control signal ECS1.

Accordingly, the first emission drivers 311 and 311' may supply the first emission control signals to the same emission control line concurrently (e.g., at the same time).

Further, the first emission drivers 311 and 311' may have the same or substantially the same circuit structure with each other.

The second emission drivers 312 and 312' may be connected to respective ends of the second emission control lines E21 to E2$n$.

The second emission drivers 312 and 312' may supply second emission control signals to the second emission control lines E21 to E2$n$ in response to the same or substantially the same second emission driver control signal ECS2.

Accordingly, the second emission drivers 312 and 312' may supply the second emission control signals to the same emission control line concurrently (e.g., at the same time).

Further, the second emission drivers 312 and 312' may have the same or substantially the same circuit structure with each other.

The third emission drivers 313 and 313' may be connected to respective ends of the third emission control lines E31 to E3$k$.

The third emission drivers 313 and 313' may supply third emission control signals to the third emission control lines E31 to E3$k$ in response to the same or substantially the same third emission driver control signal ECS3.

Accordingly, the third emission drivers 313 and 313' may supply the third emission control signals to the same emission control line concurrently (e.g., at the same time).

Further, the third emission drivers 313 and 313' may have the same or substantially the same circuit structure with each other.

It will be appreciated by those skilled in the art that the present disclosure as described above may be implemented into various other embodiments and forms, without departing from the spirit and scope of the present disclosure. Thus, it will be appreciated that the exemplary embodiments described above are intended to be illustrative in every sense, and not restrictive. The spirit and scope of the present disclosure is represented by the below claims, rather than the detailed description, and all the various changes or modified forms derived from equivalents of the claims, are within the spirit and scope of the present disclosure.

What is claimed is:

1. A display device, comprising:
   first pixels at a first pixel area and connected to first scan lines;
   a first scan driver configured to supply first scan signals to the first scan lines;
   second pixels at a second pixel area and connected to second scan lines;
   a second scan driver configured to supply second scan signals to the second scan lines;
   third pixels at a third pixel area and connected to third scan lines; and
   a third scan driver configured to supply third scan signals to the third scan lines,
   wherein, in a first mode, each of the first scan signals has at least a portion having a first pulse width, and each of the second scan signals has at least a portion having a second pulse width different from the first pulse width, and
   wherein the first pixel area and the third pixel area have smaller areas than an area of the second pixel area.

2. The display device of claim 1, wherein the first pulse width is smaller than the second pulse width.

3. The display device of claim 1, wherein in a second mode different from the first mode, the first scan signals and the second scan signals have the same pulse width.

4. The display device of claim 3, wherein in the first mode, each of the third scan signals has at least a portion having a third pulse width different from the second pulse width.

5. The display device of claim 4, wherein the third pulse width is smaller than the second pulse width.

6. The display device of claim 4, wherein in the second mode, the first scan signals, the second scan signals, and the third scan signals have the same pulse width.

7. The display device of claim 1, wherein the second pixel area is between the first pixel area and the third pixel area.

8. The display device of claim 3, wherein the first scan driver, the second scan driver, and the third scan driver are configured to sequentially supply the first scan signals, the second scan signals, and the third scan signals during one frame period.

9. The display device of claim 8, wherein the one frame period includes a first period for supplying the first scan signals, a second period for supplying the second scan signals, and a third period for supplying the third scan signals.

10. The display device of claim 9, wherein each of the first period, the second period, and the third period comprises a plurality of horizontal periods, and in the first mode, lengths of the horizontal periods of each of the first period and the third period are smaller than lengths of the horizontal periods of the second period.

11. The display device of claim 10, wherein in the second mode, the lengths of the horizontal periods of each of the first period, the second period, and the third period are the same.

12. The display device of claim 1, wherein each of the first scan signals, the second scan signals, and the third scan signals includes a plurality of pulses.

13. A display device, comprising:
    first pixels at a first pixel area and connected to first scan lines;
    a first scan driver configured to supply first scan signals to the first scan lines;
    second pixels at a second pixel area and connected to second scan lines;
    a second scan driver configured to supply second scan signals to the second scan lines;
    third pixels at a third pixel area and connected to third scan lines; and
    a third scan driver configured to supply third scan signals to the third scan lines,
    wherein, in a first mode, each of the first scan signals has at least a portion having a first pulse width, and each of the second scan signals has at least a portion having a second pulse width different from the first pulse width,
    wherein in the first mode, each horizontal line of the first pixel area is configured to display the same image, and each horizontal line of the third pixel area is configured to display the same image.

14. The display device of claim 13, wherein in the first mode, each horizontal line of the first pixel area is configured to display, during a current frame, the same image that is displayed in a first horizontal line of the second pixel area during a previous frame.

15. The display device of claim 14, wherein in the first mode, each horizontal line of the third pixel area is configured to display, during the current frame, the same image that is displayed in a last horizontal line of the second pixel area during the previous frame.

16. The display device of claim 1, wherein the first scan driver is configured to start supplying the first scan signals in response to a start signal,
    the second scan driver is configured to start supplying the second scan signals in response to a last first scan signal from among the first scan signals, and
    the third scan driver is configured to start supplying the third scan signals in response to a last second scan signal from among the second scan signals.

17. A method of driving a display device, comprising:
    supplying first scan signals, second scan signals, and third scan signals to first pixels of a first pixel area, second pixels of a second pixel area, and third pixels of a third pixel area, respectively, each of the first scan signals, the second scan signals, and the third scan signals having the same pulse width, when the display device is driven in a second mode;
    switching the display device from the second mode to a first mode; and
    supplying the first scan signals having a first pulse width, the second scan signals having a second pulse width, and the third scan signals having a third pulse width to the first pixels, the second pixels, and the third pixels, respectively, when the display device is driven in the first mode,
    wherein the first pulse width and the third pulse width are different from the second pulse width, and
    wherein the first pixel area and the third pixel area have smaller areas than an area of the second pixel area.

18. The method of claim 17, wherein the first pulse width and the third pulse width are smaller than the second pulse width.

19. The method of claim 17, wherein the display device is switched to the first mode when the display device is mounted on a wearable device.

* * * * *